United States Patent
Chua et al.

(10) Patent No.: US 7,375,009 B2
(45) Date of Patent: May 20, 2008

(54) METHOD OF FORMING A CONDUCTIVE VIA THROUGH A WAFER

(75) Inventors: Swee Kwang Chua, Singapore (SG); Suan Jeung Boon, Singapore (SG); Yong Poo Chia, Singapore (SG); Yong Loo Neo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/232,267

(22) Filed: Aug. 28, 2002

(65) Prior Publication Data

US 2003/0232488 A1    Dec. 18, 2003

(30) Foreign Application Priority Data

Jun. 14, 2002 (SG) ............... 200203615-0

(51) Int. Cl.
*H01L 21/78* (2006.01)
*H01L 21/46* (2006.01)
*H01L 21/301* (2006.01)

(52) U.S. Cl. ............. 438/460; 438/462; 438/667
(58) Field of Classification Search ............ 438/42, 438/113, 460, 462, 667
See application file for complete search history.

(56) References Cited

U.S. PATENT DOCUMENTS

| | | | |
|---|---|---|---|
| 3,735,214 A | 5/1973 | Renskers et al. | |
| 4,141,456 A * | 2/1979 | Hart | 414/787 |
| 4,355,457 A | 10/1982 | Barlett et al. | |
| 4,610,079 A | 9/1986 | Abe et al. | |
| 4,764,846 A | 8/1988 | Go | |
| 4,786,960 A | 11/1988 | Jeuch | |
| 4,790,894 A | 12/1988 | Homma et al. | |

(Continued)

FOREIGN PATENT DOCUMENTS

CA    2330426    11/1998

(Continued)

OTHER PUBLICATIONS

"Application Serial No. 10-744632 Final office action mailed Jan. 31, 2007", 11 pgs.

(Continued)

*Primary Examiner*—Zandra V. Smith
*Assistant Examiner*—Khanh Duong
(74) *Attorney, Agent, or Firm*—Schwegman, Lundberg & Woessner, P.A.

(57) ABSTRACT

Through vias in a substrate are formed by creating a trench in a top side of the substrate and at least one trench in the back side of the substrate. The sum of the depths of the trenches at least equals the height of the substrate. The trenches cross at intersections, which accordingly form the through vias from the top side to the back side. The through vias are filled with a conductor to form contacts on both sides and the edge of the substrate. Contacts on the backside are formed at each of the trench. The through vias from the edge contacts. Traces connect bond pads to the conductor in the through via. Some traces are parallel to the back side traces. Some traces are skew to the back side traces. The substrate is diced to form individual die.

35 Claims, 14 Drawing Sheets

U.S. PATENT DOCUMENTS

| | | | |
|---|---|---|---|
| 4,871,418 A * | 10/1989 | Wittlinger et al. | 438/106 |
| 4,896,459 A | 1/1990 | Brandt | 51/5 |
| 4,930,216 A | 6/1990 | Nelson | |
| 4,961,821 A * | 10/1990 | Drake et al. | 438/21 |
| 4,983,251 A | 1/1991 | Haisama et al. | |
| 5,091,331 A | 2/1992 | Delgado et al. | |
| 5,126,286 A | 6/1992 | Chance et al. | |
| 5,146,308 A | 9/1992 | Chance et al. | |
| 5,166,097 A * | 11/1992 | Tanielian | 438/667 |
| 5,272,114 A * | 12/1993 | van Berkum et al. | 438/33 |
| 5,302,554 A | 4/1994 | Kashiwa et al. | |
| 5,302,849 A | 4/1994 | Cavasin | |
| 5,356,081 A | 10/1994 | Sellar | |
| 5,543,365 A | 8/1996 | Wills et al. | |
| 5,552,345 A | 9/1996 | Schrantz et al. | |
| 5,606,198 A | 2/1997 | Ono et al. | |
| 5,648,684 A | 7/1997 | Bertin et al. | |
| 5,661,901 A | 9/1997 | King | |
| 5,663,105 A | 9/1997 | Sua et al. | |
| 5,729,437 A | 3/1998 | Hashimoto | |
| 5,825,076 A * | 10/1998 | Kotvas et al. | 257/622 |
| 5,879,964 A | 3/1999 | Paik et al. | 438/113 |
| 5,888,884 A | 3/1999 | Wojnarowski | |
| 5,900,582 A | 5/1999 | Tomita et al. | |
| 5,902,499 A | 5/1999 | Richerzhagen | |
| 5,904,546 A | 5/1999 | Wood et al. | |
| 5,904,548 A * | 5/1999 | Orcutt | 438/462 |
| 5,925,934 A | 7/1999 | Lim | |
| 5,952,611 A | 9/1999 | Eng et al. | |
| 5,990,566 A | 11/1999 | Farnworth et al. | |
| 6,004,188 A | 12/1999 | Roy | |
| 6,040,618 A | 3/2000 | Akram | |
| 6,054,760 A | 4/2000 | Martinez-Tovar et al. | |
| 6,072,236 A | 6/2000 | Akram et al. | |
| 6,087,203 A | 7/2000 | Eng et al. | |
| 6,096,635 A * | 8/2000 | Mou et al. | 438/637 |
| 6,133,065 A | 10/2000 | Akram | |
| 6,137,164 A | 10/2000 | Yew et al. | |
| 6,204,186 B1 | 3/2001 | Chaudhry et al. | |
| 6,228,687 B1 | 5/2001 | Akram et al. | |
| 6,236,107 B1 | 5/2001 | Chan et al. | |
| 6,268,642 B1 | 7/2001 | Hsuan et al. | |
| 6,271,060 B1 | 8/2001 | Zandman et al. | |
| 6,294,837 B1 | 9/2001 | Akram et al. | |
| 6,295,978 B1 | 10/2001 | Wark et al. | |
| 6,319,354 B1 | 11/2001 | Farnworth et al. | |
| 6,326,689 B1 | 12/2001 | Thomas | |
| 6,365,833 B1 | 4/2002 | Eng et al. | |
| 6,379,999 B1 | 4/2002 | Tanabe | |
| 6,383,835 B1 | 5/2002 | Hata et al. | |
| 6,387,729 B2 | 5/2002 | Eng et al. | |
| 6,414,374 B2 | 7/2002 | Farnworth et al. | |
| 6,427,676 B2 | 8/2002 | Akram et al. | |
| 6,462,399 B1 | 10/2002 | Akram | |
| 6,521,995 B1 | 2/2003 | Akram et al. | |
| 6,534,382 B1 | 3/2003 | Sakaguchi et al. | |
| 6,555,294 B1 | 4/2003 | Albertini et al. | |
| 6,656,765 B1 | 12/2003 | DiCaprio | |
| 6,677,675 B2 | 1/2004 | Bolken | |
| 6,733,711 B2 | 5/2004 | Durocher et al. | |
| 6,743,696 B2 | 6/2004 | Jeung et al. | |
| 6,750,547 B2 | 6/2004 | Jeung et al. | |
| 6,836,009 B2 | 12/2004 | Koon et al. | |
| 6,930,382 B2 | 8/2005 | Sawada et al. | |
| 6,946,324 B1 | 9/2005 | McLellan et al. | |
| 2001/0021541 A1 | 9/2001 | Akram et al. | |
| 2001/0030357 A1 | 10/2001 | Murata | |
| 2002/0001882 A1 | 1/2002 | Eng et al. | |
| 2002/0019069 A1 | 2/2002 | Wada | |
| 2002/0030245 A1 | 3/2002 | Hanaoka et al. | |
| 2002/0031864 A1 | 3/2002 | Ball | |
| 2002/0094607 A1 | 7/2002 | Gebauer et al. | |
| 2002/0139577 A1 | 10/2002 | Miller | |
| 2002/0164838 A1 | 11/2002 | Moon et al. | |
| 2003/0060034 A1 | 3/2003 | Beyne et al. | |
| 2003/0071335 A1 | 4/2003 | Jeung et al. | |
| 2003/0071341 A1 | 4/2003 | Jeung et al. | |

FOREIGN PATENT DOCUMENTS

| | | |
|---|---|---|
| EP | 0689245 A2 | 12/1995 |
| EP | 0818818 | 1/1998 |
| EP | 1071126 A2 | 1/2001 |
| EP | 1073099 A2 | 1/2001 |
| JP | 58-036939 | 3/1983 |
| JP | 2002-170904 | 6/2002 |
| WO | WO-99/56907 | 11/1999 |
| WO | WO-00/75983 | 12/2000 |
| WO | WO-0075985 A1 | 12/2000 |
| WO | WO-01/75966 | 10/2001 |

OTHER PUBLICATIONS

"Application Serial No. 10-744632 Non-final office action mailed Jul. 2, 2007", 9 pgs.

"Application Serial No. 10-744632 Non-final office action mailed Oct. 5, 2006", 15 pgs.

"Application Serial No. 10-744632 Response filed Nov. 30, 2006 to Non-final office action mailed Oct. 5, 2006", 19 pgs.

* cited by examiner

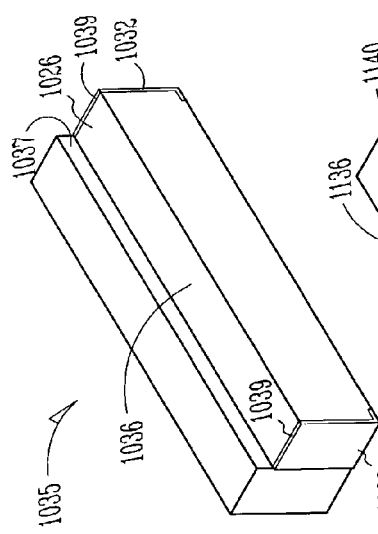
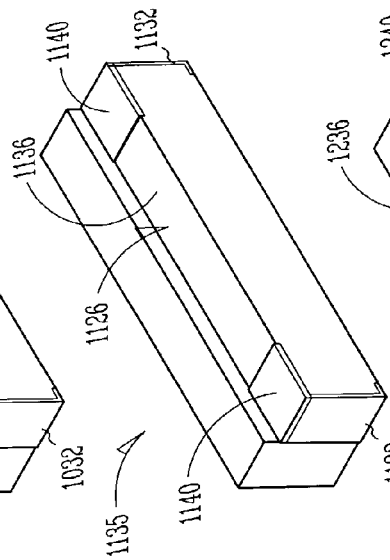
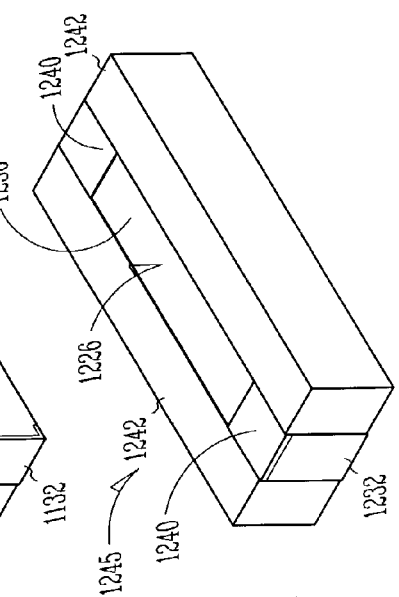
Fig.10
Fig.11
Fig.12
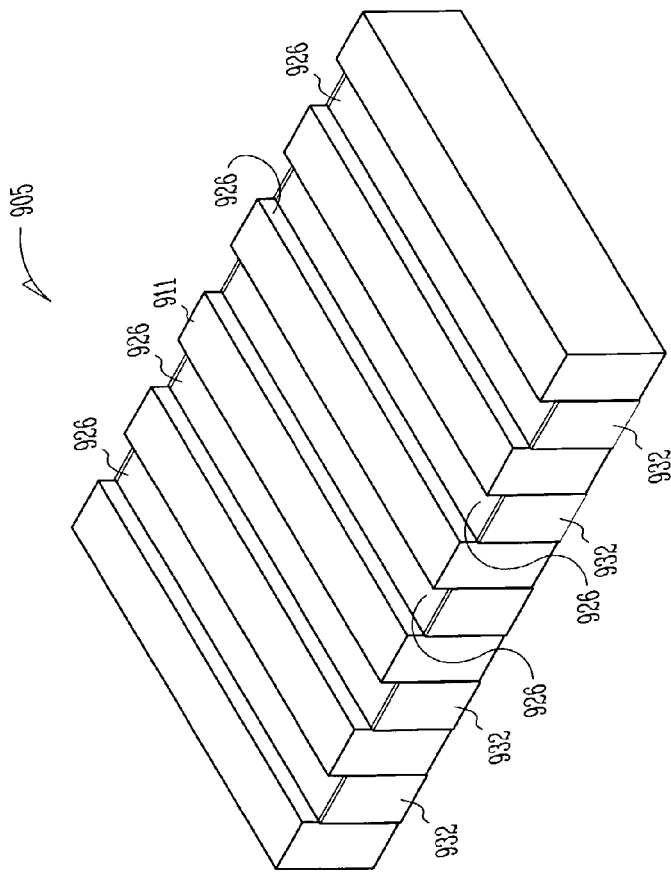
Fig.9

METHOD OF FORMING A CONDUCTIVE VIA THROUGH A WAFER

This application claims priority under 35 U.S.C. 119 from Singapore Application No. 200203615-0, filed Jun. 14, 2002, which application is incorporated herein by reference.

FIELD OF THE INVENTION

The present invention relates to wafer level packaging techniques and structures. More particularly, the present invention relates to forming vias in a wafer level package.

BACKGROUND OF THE INVENTION

Wafer level packaging provides a complete electronic device package at the wafer level. This provides a package having a high density of integrated circuits in a small or ultra-thin profile package. Electronic devices and associated software applications continue to demand more memory and processing power from chip packages. However, electronic devices that use such chip packages have continued to shrink. Thus, the demand for integrated circuit packages having a high density in a smaller package has also increased. While it is desirable to design a new die that meets all of the needs of the market, such a design may not be feasible or ready for market. Thus, dies or chips are connected together, e.g., stacked, to achieve the desired density and electronic capacity. Wafer level packaging is used to meet these demands. However, most wafer level packaging processes have not had industrial success as such processes require a significant amount of wafer thinning followed by etching or laser drilling processes to create through holes in the wafer level package.

SUMMARY OF THE INVENTION

The present invention includes methods for creating a through via in a substrate and the resulting structures. Trenches are mechanically formed in the two sides of a substrate. Where the trenches cross through vias or holes are formed. In an embodiment, the method includes sawing into a fabrication side of a substrate and sawing into a backside of the substrate so that the sawing on the fabrication side and sawing on the backside cross each other to form the via. The depths of the sawing into the two sides of the substrate are at least equal to the height of the substrate. In an embodiment, the substrate is a wafer that includes a plurality of dies each containing integrated circuits. The integrated circuits, in various embodiments, form memory devices, logic circuits and/or processor circuits.

In an embodiment, the method of the present invention includes forming trenches on a first side of the substrate and forming trenches on a second side of the substrate to form the through vias at the intersection of the trenches. Forming includes mechanically forming the trenches. In an embodiment, the trenches on one side are orthogonal to the trenches on the other side. In an embodiment, trenches on a fabrication side of the substrate are formed in saw streets. In an embodiment, the trenches formed on the back or non-active side of the substrate are formed beneath the dies or integrated circuits. Thus, the intersections of the trenches that form the through vias are in the saw streets. The dimensions of the through vias are determined by the widths of the trenches formed on each side of the substrate. The widths of the trenches are determined by the widths of the mechanical cutter used to create the respective trench. The through vias include a conductor material to form a contact or communication line from the top side of the substrate to the back side. In an embodiment, contacts are formed in the back side trenches, which contacts are connected to the conductor material in the through vias.

Methods and structures of the present invention further include the number of trenches formed in the back side of the substrate and how the back side trenches relate to the die components. In an embodiment, the number of trenches formed in the back side of the substrate are equal to or less than the number of bond pads on the dies. In an embodiment, the number of trenches formed in the back side of the substrate are equal to half the number of bond pads. The bond pads are connected to one through via that is positioned adjacent the respective die. Traces connect the bond pads to the through vias. In an embodiment, the traces are formed so that they alternate which sides of the die they extend to and thus, adjacent bond pads are connected to conductors in through vias on opposite sides of the die. In an embodiment, some traces are parallel to trenches in the back side of the substrate. In an embodiment, some of the traces are skew to trenches in the back side of the substrate.

In an embodiment, the method of creating a via through a wafer includes providing a substrate with at least one integrated circuit, forming a first trench in the top side of the substrate, and forming a second trench in the back side of the substrate so that the second trench crosses the first trench to form a through via. In an embodiment, a conductor is inserted in the through via to extend from the top side to the back side. This forms an edge contact and provides a connection from the fabrication side of the substrate to a contact on the back side of the substrate. In an embodiment, bond pads are on the substrate fabrication side. The bond pads are connected to the conductor. In an embodiment, a back side contact is formed at one end of the second trench and connected to the conductor. In an embodiment, back side contacts are formed at each end of the back side trench. In an embodiment, the method further includes backgrinding the back side of the substrate so that the back side is essentially coplanar to the back side contact.

An embodiment of the present invention provides a method for stacking integrated circuit devices. The method includes providing a first substrate including a plurality of first integrated circuit devices separated by streets, forming first trenches in the streets on a top side of the first substrate, and forming second trenches on the backside of the first substrate so that the second trenches and first trenches intersect to form through vias from the top side to the backside of the first substrate. In an embodiment, the method further includes inserting a conductor into the through vias to form contacts on the top side and the backside, connecting the conductor to at least one of the plurality of first integrated circuit devices. A second substrate, which includes a plurality of second individual integrated circuit devices separated by streets, is connected to the first substrate. In an embodiment, the plurality of second integrated circuit devices are connected to the first plurality of integrated circuit devices. Connected pairs of the connected first integrated circuit devices and second integrated circuit devices are separated from the other pairs of connected first integrated circuit devices and second integrated circuit devices. In an embodiment, the method includes forming third trenches in the streets on a top side of the second substrate, forming fourth trenches on the backside of the second substrate so that the third and fourth trenches intersect to form through vias from the top side to the backside of the second substrate, and inserting a conductor into the through vias to form contacts on the top side and the backside. In an embodiment, the method includes connecting the conductor to at least one of the plurality of second integrated circuit devices. In an embodiment, the fourth trenches are formed beneath at least one of the second integrated circuit devices. In an embodiment, the fourth trenches are linear. In an embodiment, the trenches and saw streets of the first and second substrates are aligned prior to dicing.

An embodiment of the present invention is directed to a method of forming a substrate level package of two integrated circuit devices. The method includes providing a first substrate including a plurality of first dies separated by streets, the first dies including bond pads on an active side of the substrate and traces connected to the bond pads, forming first trenches in the streets on a top side of the first substrate, forming second trenches on the backside of the first substrate so that the second trenches and first trenches intersect to form through vias from the top side to the backside of the first substrate, and inserting a conductor into the through vias to form contacts on the top side and the backside. The first substrate is connected to a second substrate. In an embodiment, the first and second substrate are formed the same. In an embodiment, the first and second substrates are mirror images of each other. The method further includes connecting the conductor to at least one of the bond pads using one of the traces. In an embodiment, the second substrate includes a plurality of second individual integrated circuit devices separated by streets. The method further includes, in an embodiment, connecting the plurality of second integrated circuit devices to the first plurality of integrated circuit devices and separating connected pairs of the connected first integrated circuit devices and second integrated circuit devices from the other pairs of connected first integrated circuit devices and second integrated circuit devices. In an embodiment, the method of the present invention includes encapsulating a pair of the connected first integrated circuit device and second integrated circuit device. In an embodiment, the contacts to the pair of the connected first integrated circuit device and second integrated circuit device are at the backside of one of the first and second integrated circuit devices of the pair. Thus, the active device fabrication side of the substrates are connected together and aligned. In an embodiment, the bond pads of the first and second integrated circuit devices are connected to provide communication between the devices. In an embodiment, the traces of the first and second integrated circuit devices are connected to provide communication between the devices. In an embodiment, the conductors in the through vias of the second substrate are connected to the conductors in the through vias of the first substrate.

Further features and advantages of the present invention, as well as the structure and operation of various embodiments of the present invention, are described in detail below with reference to the accompanying drawings.

BRIEF DESCRIPTION OF THE DRAWINGS

FIG. 9 is a partial bottom perspective view of a die according to the present invention.

FIG. 10 is a partial view of the FIG. 9 die.

FIG. 11 is a partial view of the FIG. 10 die after a processing step.

FIG. 12 is a partial view of the FIG. 11 die after a processing step. top view of a die according to the further embodiment of the present invention.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present description employs a number convention where the first (leftmost), most significant digit(s) are the same as the figure number on which the numbers appear. Accordingly, like or similar elements will have the same least significant digits. For example, the substrate, wafer, or base layer is designated by the convention X00, where "X" is the figure number, e.g., 100, 200, 300, etc.

The present description uses the terms "top" and "back" when referring to the substrate on which integrated circuits are formed. The term "top" refers to the surface on which the layers that form an active integrated circuit structure are formed. The term "back" refers to the region of the substrate beneath the surface on which active circuit structures are formed.

Figure 1:
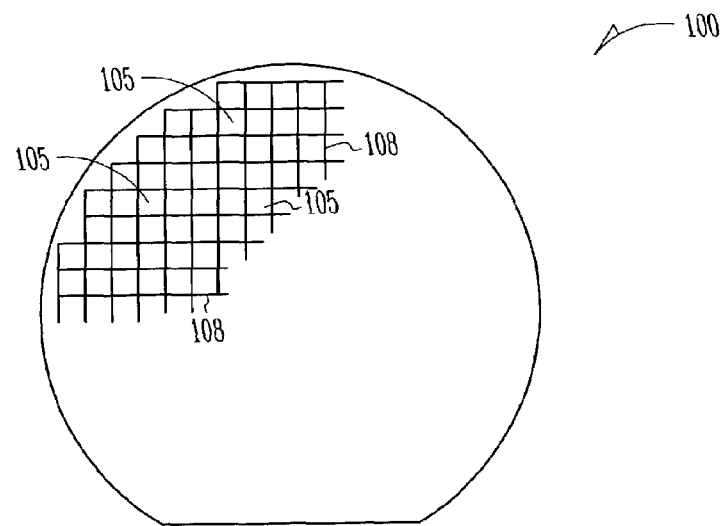
FIG. 1 shows a substrate having a plurality of die.

FIG. 1 shows a wafer 100 that includes a plurality of die 105 each separated from adjacent die by saw streets 108. The die 105 each include integrated circuits and contacts that provide communication between the integrated circuits and circuits outside the substrate and die. The die 105, in an embodiment, includes a memory circuit. The memory circuit includes a dynamic random access memory (DRAM). In other embodiments the memory circuit includes at least one of SRAM (Static Random Access Memory) or Flash memories. Additionally, the DRAM could be a synchronous memory device such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies as known in the art. The integrated circuits of the die 105, in an embodiment, define logic circuits. Die 105 may further include a processor. The die 105, in an embodiment, include a system on a chip, which has a plurality of different integrated circuit structures, e.g., logic circuits and memory circuits. The saw streets 108 do not contain integrated circuits. The saw streets 108 define non-active areas of the substrate whereat the substrate is divided into individual dies 105.

Figure 2:
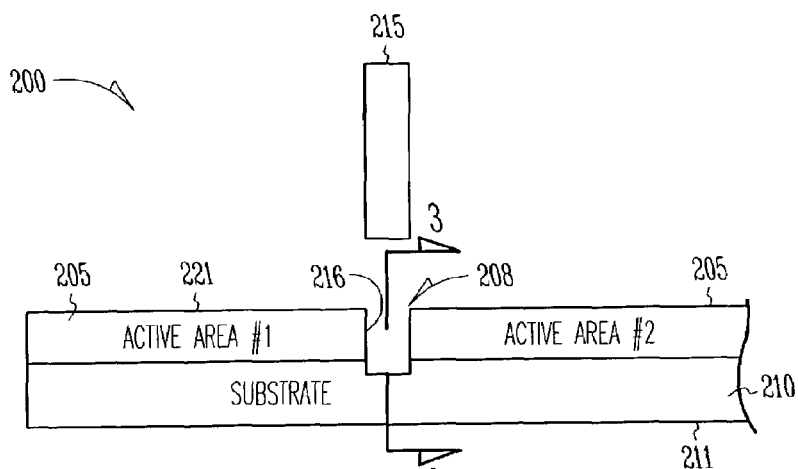
FIG. 2 is an elevational view of a partial wafer during a processing step according to the present invention.

FIG. 2 shows a side view of a partial substrate, e.g., a wafer, 200 that includes a plurality of dies 205. The dies 205 include integrated circuits (not shown) that are fabricated using techniques known in the art, such as etching, lithography, deposition, doping, etc. A portion 210 of the substrate 200, herein defined as the back, does not contain integrated circuits. The back portion 210 acts as base for supporting the active area that contains integrated circuits. The back portion includes a back surface 211 that comes into contact with substrate handling equipment (not shown) during fabrication. A saw street 208 is formed intermediate the dies 205. A mechanical cutter 215 is aligned with the saw street 208 and forms a recessed, closed bottom trench 216 in the saw street 208. The recessed trench 216, in an embodiment, is formed by cutting a kerf in the substrate 200 along the saw streets. The trenches 216, in an embodiment, extend the length of the dies 205. The trenches 216, in an embodiment, extend from one side of the substrate 200 to the other side of the substrate 200. The trenches 216 are linear. The width of the mechanical cutter 215 defines the width of the trenches 216. In an embodiment, the mechanical cutter 215 is a saw blade. In an embodiment, the saw blade is a circular saw blade that is mounted to a rotational drive such as an electric motor (not shown). The saw blade along its outer cutting circumference includes a diamond material. In operation, the mechanical cutter 215 is aligned with a saw street 208 outside the outer boundary of the substrate 200. The cutter 215 is first brought into contact with the outer boundary of the substrate 200 at the saw street 208. Mechanical cutter 215 and the substrate 200 relatively and linearly move such that the cutter forms the trench 216 in the substrate. In an embodiment, the cutter 215 is stationary and the substrate 200 moves relative to the cutter 215. In an embodiment, the substrate 200 is stationary and the cutter 215 moves relative to the substrate. The cutter 215 is positioned so that it cuts through a top surface 221 into the body of the substrate 200. The top surface 221 is the surface of the substrate 200 wherein and whereon active integrated circuits are fabricated. However, the cutter 215 does not cut completely through the base portion 210 of the substrate. That is, the cutter 215 when creating the trenches 216 does not cut through back surface 211. In an embodiment, the cutter cuts into the base portion 210 of the substrate. This results in the trenches 216 being open at the substrate top surface 221 and being closed at the bottom of the trench, which is spaced upwardly from the substrate back surface 211. Accordingly, the cutter 215 forms the trenches 216 to about half the thickness of the substrate 200. In an embodiment, the cutter 215 forms the trenches to over half the thickness of the substrate 200. In an embodiment, the cutter 215 forms the trenches to about two-thirds the thickness of the substrate 200. In an embodiment, the cutting process described herein is repeated for each of the saw streets. In an embodiment, the cutting process described herein is repeated for only those saw streets 208 that extend in a same direction or that are parallel. In this embodiment, the saw streets that are transverse to the same direction saw streets 208 that include trenches 216 are not cut.

Figure 3:
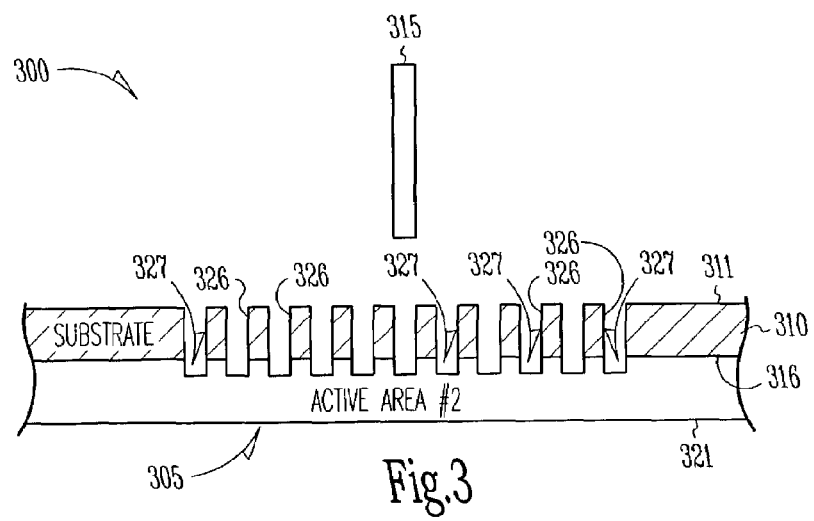
FIG. 3 is a view of the FIG. 2 partial wafer taken generally along line 3-3 during a processing step according to the present invention.

FIG. 3 shows a substrate 300 after further processing of the FIG. 2 substrate 200. A mechanical cutter 315 is positioned adjacent the nonactive substrate back portion 310 containing back side 311 of the substrate 300. In an embodiment, the substrate 200 is flipped after the top trenches 216 are formed. In an embodiment, the substrate 300 is in the same orientation as the FIG. 2 substrate 200 and the mechanical cutter 315 is positioned beneath the substrate. The mechanical cutter 315 includes the same embodiments as described herein for mechanical cutter 215. Cutter 315 is aligned with the outer boundary of substrate 300 and first contacts and begins cutting at the outer edge of the substrate 300. The cutter 315 cuts at least one back trench or kerf 326, which is shown on the top of FIG. 3. The term "back" refers to a back or base area of a wafer or substrate on which integrated circuit layers are formed and that supports the active area and does not contain active integrated circuit components. The back trench 326 is at least to half the thickness of the substrate 300. The back trench 326 is about half the thickness of the substrate 300. The back trench 326 is less than about half the thickness of the substrate 300. In an embodiment, the back trench 326 is about one-third the thickness of the substrate 300. In an embodiment, a plurality of back trenches 326 are formed beneath an active area of a die 205. The back trenches 326 are cut at a different angle than the top trenches 316. Specifically, the directions of the IC fabrication side trenches 316 and the back trenches 326 are transverse to each other. In an embodiment, the directions of the trenches 316 and 326 are orthogonal. In an embodiment, the directions of the trenches 316 and 326 are at about 90 degrees with respect to each other. In an embodiment, directions of the trenches 316 and 326 are at about 45 degrees with respect to each other. In an embodiment, directions of the trenches 316 and 326 are at an angle of greater than about 45 degrees with respect to each other. In an embodiment, directions of the trenches 316 and 326 are at an angle greater than about 10 degrees with respect to each other. The trench(es) 326 are formed at a depth that causes them to physically cross at least one of the top trench(es) 316 at intersections 327. These intersections 327 form through holes (apertures) that extend from the substrate first, top side 311 to the substrate second, back side 321. However, the substrate 300 remains in a large scale form factor, e.g., wafer. That is, a plurality of dies 305 remain connected to each other through the non-cut back region 310 of substrate 300. In an embodiment, the back trenches 326 are parallel to some of the top trenches 316 formed in saw streets.

Figure 4:
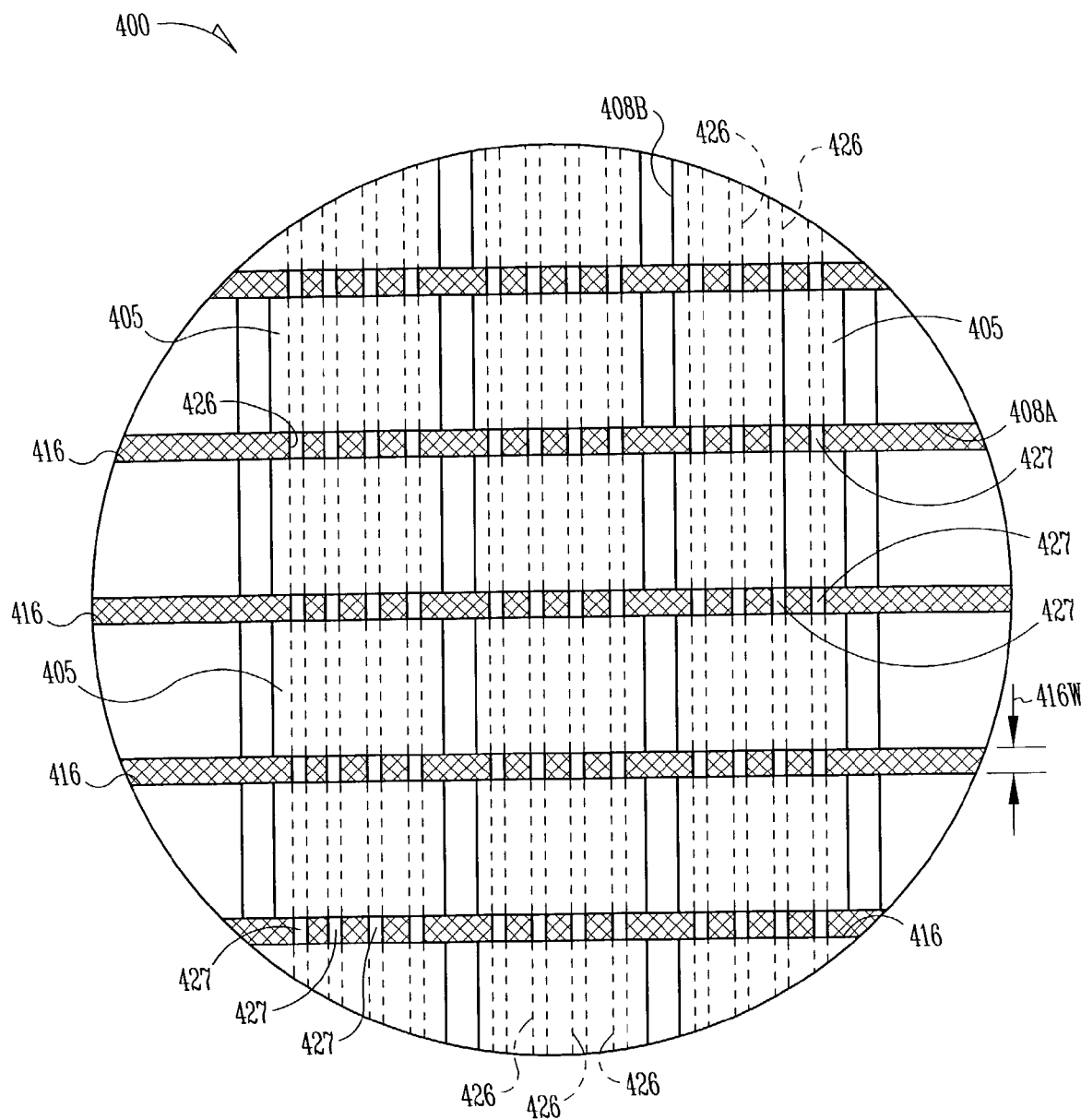
FIG. 4 is a plan view of a wafer during processing thereof according to the teachings of the present invention.

FIG. 4 shows a substrate 400 according to the present invention. Substrate 400 includes a plurality of die 405 separated by saw streets 408A and 408B. Saw streets 408A extend in a first direction. Saw streets 408B extend in a second direction generally perpendicular to saw streets 408A. Top trenches 416 are formed in saw streets 408A. A plurality of back trenches 426 are formed in the back portion of substrate 400. Each of the back trenches 426 extend under a plurality of dies 405 that are linearly aligned in the second direction. A plurality of back trenches 426 extend under each aligned die 405 and intersect each of the top trenches 416 that extend transverse to the direction of the back trenches 426. Through vias 427 are formed at the intersections of the top and back trenches 416, 426. The back trenches 426, in the illustrated embodiment, extend parallel to the second direction saw streets 408B. Accordingly, back trenches 426 do not form intersections or through vias with any trench or kerf formed in the saw streets 408B. In the illustrated embodiment, no trenches are formed in the saw streets 408B.

Figure 5:
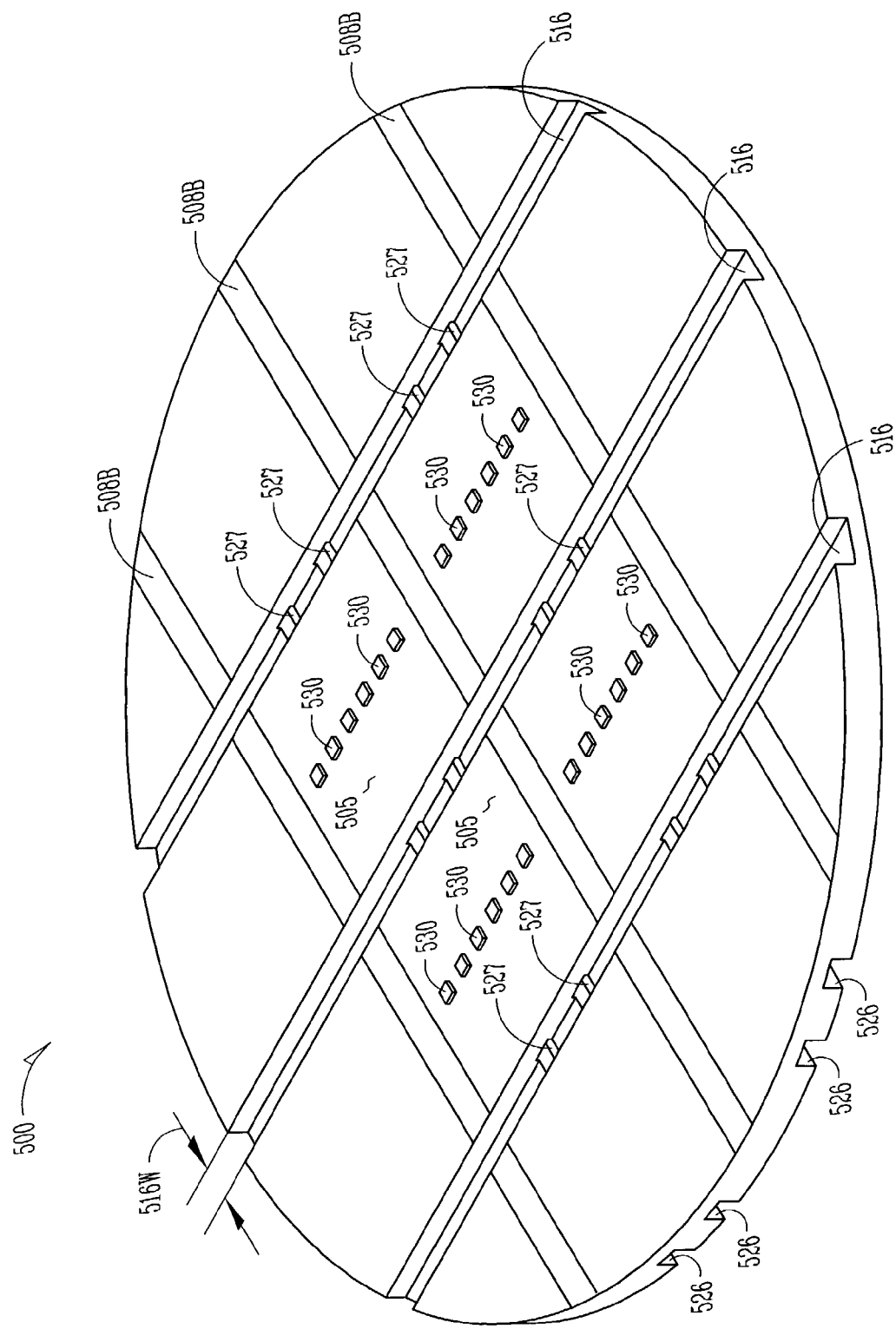
FIG. 5 is a top perspective view of a wafer according to the teachings of the present invention.

FIG. 5 shows a top perspective view of a substrate 500 according to an embodiment of the present invention. Substrate 500 includes a plurality dies 505 bound on two parallel sides by saw streets 508B and on the other two parallel sides by trenches 516. In an embodiment, the trenches 516 are top kerfs formed by mechanical cutting. The back, nonactive device portion of substrate 500 is mechanically cut to form back trenches 526. In an embodiment, the back trenches 526 are kerfs as described herein. The top trenches 516 and back trenches 526 intersect at 527 to form through vias extending completely through substrate 500, i.e. from the top side to the back side. Each of the dies 505 further includes bond pads 530. Bond pads 530 are conductive contacts that are electrically connected to the integrated circuits of die 505. The bond pads 530 form connectors to circuits external to the die 505. In an embodiment, the bond pads 530 are connected to leads in a package (not shown). Bond pads 530 are formed by metalization of a nonmasked area of the wafer 500. Bond pads 530 are formed inwardly from the edges of die 505, the edges being defined by saw streets 508B and top trenches 516. The bond pads 530 are formed in a line essentially centered on die. That is, each bond pad 530 is equal distant from the two trenches 516 that bound the two opposite sides of the generally rectangular die. Further, the bond pads 530 are positioned inwardly on the die 505 from the saw streets 508B, which as shown in FIG. 5 are not cut or trenched.

Figure 6:
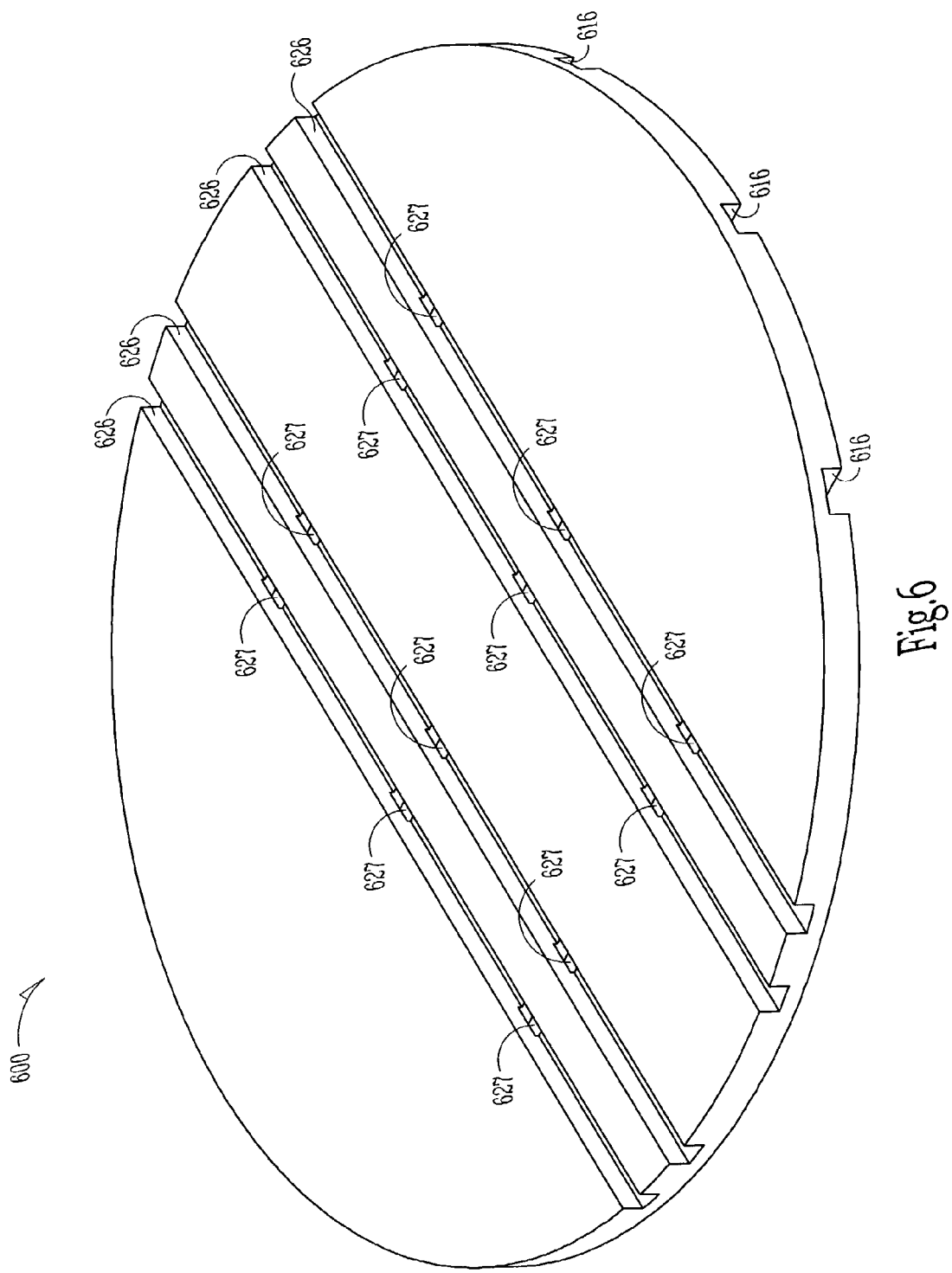
FIG. 6 is a bottom perspective view of a wafer according to the teachings of the present invention.

FIG. 6 shows a back perspective view of a substrate 600, which is the same as substrate 500. Substrate 600 includes a plurality of active circuit side trenches or kerfs 616 and a plurality of non-active circuit side trenches or kerfs 626. The trenches 616 and 626 extend transverse to each other, essentially perpendicular as shown in FIG. 6, and intersect at 627 to form the through vias.

The width of the top trenches 216, 316, 416, 516, in an embodiment, are formed by using a mechanical cutter 215 or 315. The width of the top trenches (kerfs) are equal to the width of the mechanical cutter. Accordingly, the mechanical cutter only makes a single pass on the substrate 200, 300, 400, 500 or 600 to form one kerf. The kerf width 416W, 516W, in an embodiment, is about 200 micrometers. The kerf width 416W, 516W, in an 200 micrometers. The width of the back trenches 326, 426, 526 are equal to the widths of the top trenches. In an embodiment, the width of the top trenches are greater than the width of the back trenches.

Figure 7A:
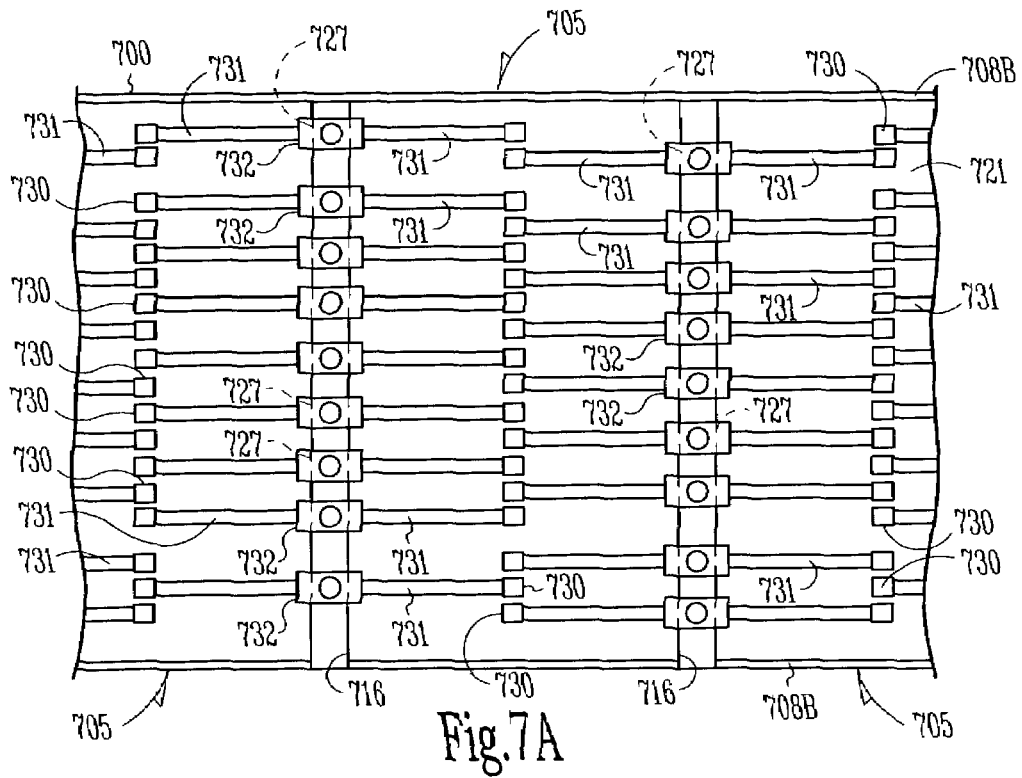
FIG. 7A is a top view of a partial substrate according to a further embodiment of the present invention.

FIG. 7A shows a partial substrate 700 that includes a full die 705 bound between two top trenches 716, which in turn abut two outer dies 705 that are partially shown. Dies 705 each include bonding pads 730 that are positioned in a line along the center of the die in its longitudinal dimension. Bonding pads 730 are positioned on the substrate top surface 721. In an embodiment, bonding pads 730 are not positioned on the back substrate surface as the integrated circuits in the die do not extend into the non-active back portion of the substrate. Bonding pads 730 are positioned longitudinally from top to bottom in the FIG. 7A embodiment. The bonding pads are equal distance from the sides of the die 705 as defined by the trenches 716. Traces 731 extend from the bonding pads 730 to edge contacts 732. Traces 731, in an embodiment, are formed by third metallization processes. The edge contacts 732 are formed by depositing a conductive material in the through vias 727. Accordingly, edge contacts 732 extend from the substrate top surface 721 to the substrate back surface (not shown in FIG. 7A). The edge contacts 732 thus are formed in the substrate top surface trenches 716 and in the substrate back surface trenches (not shown in FIG. 7A). Accordingly, electrically communication to the integrated circuits in dies 705 are made from either side of the substrate 700 through the edge contacts 732 formed in the through vias 727, and through the traces 731 and bond pads on the substrate top surface 721.

In an embodiment, the substrate 700 is coated with a non-conductive material except on the bonding pads 730, the area whereat the traces 731 are formed and the through vias 727. In an embodiment, the traces 731 are formed on top of the non-conductive material layer. Examples of the non-conductive material include polyimides, organic encapsulant, and benzocyclobutenes. The traces 731 and through vias 727 are formed in the areas free of the non-conducting material. The individual dies 705 are separated from the adjacent dies by dicing along saw street 708B and completing the cut through the substrate at top trench 716. In an embodiment, the dicing of the die 705 is performed by mechanically cutting. In an embodiment, dicing is performed by laser. In an embodiment, dicing is performed by water jet.

Figure 7B:
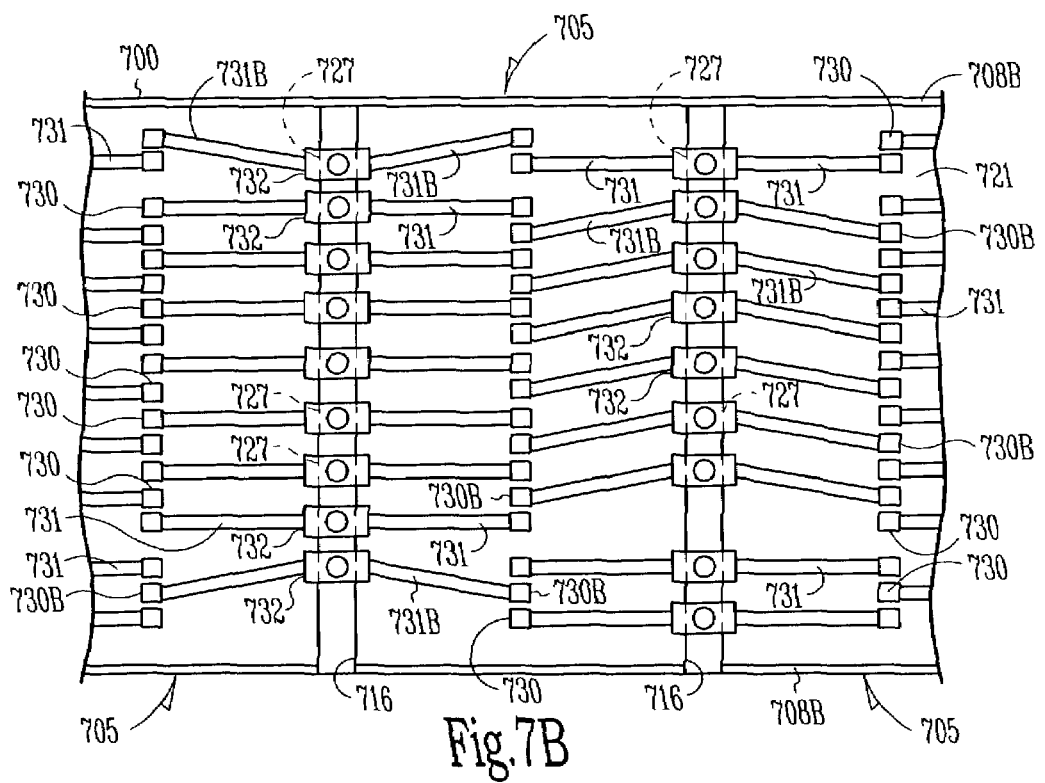
FIG. 7B is a top view of a partial substrate according to a further embodiment of the present invention.

FIG. 7B shows an embodiment of the substrate 700, which is similar to the substrate shown in FIG. 7A except some traces 731B are angled with respect to corresponding traces 731 shown in FIG. 7A. As described herein, edge contacts 732 are formed in intersections 727. The intersections 727 are through holes in the substrate 700 where the top trench 716 crosses a back trench. In the FIG. 7B embodiment, some bond pads 730B are not positioned directly over a back trench. Thus, the trace 731B that connects such bond pads 730B are angled so that the bond pads connects to an edge contact 732 formed at the same back trench as an edge contact 732 connected to an adjacent bond pad 730. This allows the substrate 700 to be formed with fewer back trenches than the number of bond pads 730, 730B. In an embodiment, the contacts 732 are formed at each end of one back trench at through vias 727. Thus, the minimum number of back trenches or through vias 727 is half the number of bond pads 730. In an embodiment, all of the traces 731B that extend to one side of the die 705 are formed at an angle. The traces 731B are not perpendicular to the top trench 716 or side of the die.

Figure 8A:
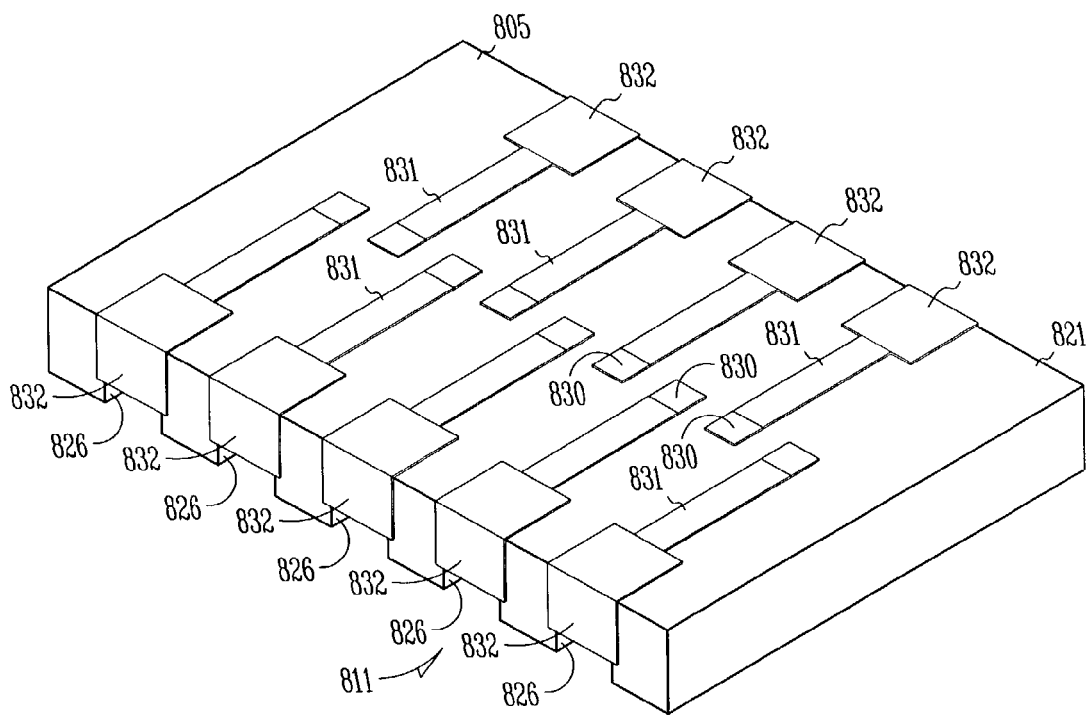
FIG. 8A is a partial top perspective view of a FIG. 7A die.

FIG. 8A shows a top perspective view of a single die 805 that is separated from a substrate, such as substrate 700 shown in FIG. 7. The die 805 is diced from the adjacent dies along both the saw streets in which a top trench was formed and the saw streets in which a trench was not formed. Die 805 has a corrugated back surface 811 due to the plurality of back side trenches 826 formed in the non-active portion of the substrate. Each of the edge contacts 832 are aligned with one of the back surface trenches 826. The die 805, in an embodiment, is packaged using the edge contacts 832 that are accessible from the top, side or back of the die. In an embodiment, the back surface 811, which does not contain active circuits, is ground until it is essentially planar. In an embodiment, the back surface 811 is ground to the back of the edge contacts 832. After the back surface 811 is ground, the die 805 is packaged. In an embodiment, the die 805 is surface mounted to a further substrate. In an embodiment, the number of back trenches 826 is at least equal to the number of bond pads 830 if the only one contact is formed in each back trench. In this embodiment, one back trench 826 is cut so that it passes directly under one bond pad 830. One contact 832 is formed at one end of each back trench 826 at the edge of the die.

Figure 8B:
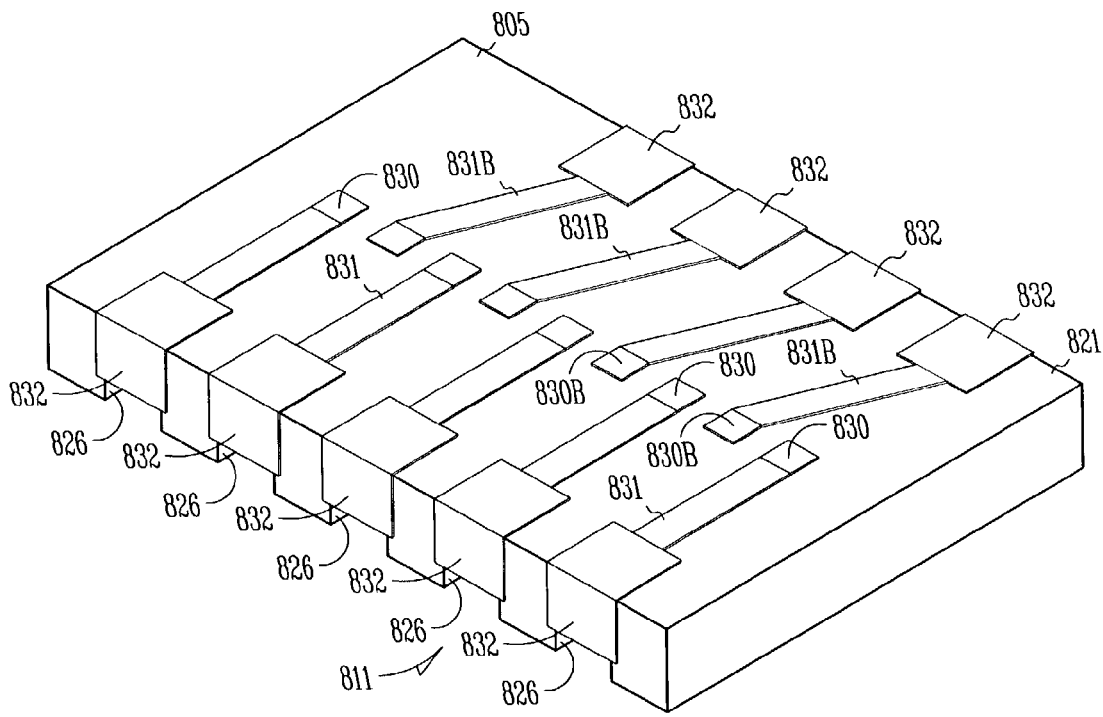
FIG. 8B is a partial top perspective view of a FIG. 7B die.

FIG. 8B shows a top perspective view of another embodiment of the present invention. Traces 831B extend from bond pads 830B to contacts 832. The bond contacts 830B are not positioned directly above the back trench 826. Accordingly, traces 831B extend at an angle to connect the bond pads 830B to the contacts 832. One contact 832 is formed at each end of one trench 826. The traces 831B are at an angle relative to the edges of the die 805. The traces 831B are at an angle with respect to traces 831 and the back trenches 826. In this embodiment, a back trench 826 is cut so that it passes directly beneath one bond pad 830. One edge contact 832 is formed at each end of the back trench at both edges of the die 805. The traces 831 are parallel to the back trench 826 and connect bond pad 830 to one edge contact at one edge of the die. The traces 831B are nonparallel to the back trench 826 and connect bond pad 830B to an edge contact at the other edge of the die. The traces 831B are parallel to each other. In this embodiment, the number of back trenches 826 is equal to half the number of bond pads 830. Thus, the number of back trenches 826 that extend under a single die 805, in an embodiment according to the present invention, is in the range of equal to the number of bond pads 830, 830B to half the number of bond pads 830, 830B.

FIG. 9 shows a die 905 that is similar to the die 805 shown in FIG. 8 but in a back perspective view. Non-active region (back) surface 911 of die 905 includes a plurality of substrate back trenches 926 that are formed according to the present invention. Accordingly, the back surface 911 has a corrugated appearance. Aligned with the back trenches 926 are edge contacts 932. The die 905 is representative of one of the plurality of dies that form a substrate or wafer during fabrication. However, for scale of illustration only a single die 905 is shown in FIG. 9. Additional dies would be connected along the sides of die 905, for example, substrates and wafers as described above.

FIG. 10 shows a portion 1035 of die 905 including one back side trench 1026 and a region of the substrate adjacent the back side trench, which region has not been cut to form the back side trench 1026. It will be recognized that this portion 1035 repeats itself to form a complete die, for example, die 905 as shown in FIG. 9. Trench 1026 is a recess that has a closed interior surface 1036 defined by the removed, e.g., cut, volume of the substrate and sides 1037 defined by the uncut region of the substrate. Edge contacts 1032 are formed at each end of the substrate portion 1035 aligned with and at the ends of the back side trench 1026. The edge contacts 1032 do not extend into the trench 1026 but include enough area to form a side contact. The back surface 1039 of the edge contact 1032 is essentially coplanar with the trench interior surface 1036.

FIG. 11 shows the FIG. 10 die portion 1035 after further processing. Die portion 1135 includes a back contact pad 1140 in the recessed trench 1126 in physical and electrical contact with a back surface of the edge contact 1132. In an embodiment, one contact pad 1140 is formed at each end of the trench 1126. The contact pad 1140 is on a portion of the recessed trench interior surface 1136. The back contact pad 1140 provides back contacts that electrically connect to the bond pads (not shown in FIG. 11) of the integrated circuit through edge contacts 1132 and traces (not shown in FIG. 11). The back contacts 1140 are formed by depositing a conductor in the trench. In an embodiment, the back surface of the substrate is masked then the conductor material is deposited in the unmasked portions in the trench 1126 which correspond to the contact pads areas at the end of the trench. In an embodiment, the substrate back surface is covered by a dielectric except at the edge contacts 1132. The conductor material is then deposited in an area at the edge contacts 1132 and in physical and electrical contact with the edge contact to form back contacts 1140. In an embodiment, back contacts are formed by third metal redistribution. In an embodiment, the conductive material covers the substrate back surface and is then etched away except for the back contacts 1140.

FIG. 12 shows a back view of a portion 1245 of the substrate after a further processing of the substrate portion 1135 as shown in FIG. 11. The portion 1245 includes both substrate regions that are adjacent and upraised relative to the back trench 1226. The substrate portion 1245 includes the trench 1226 with one edge contact 1232 aligned with each end of the trench. One back contact 1240 is formed in each end of the trench 1226. The upraised substrate back surface 1242, which is upraised relative to both the trench 1226 and the back contacts 1240 is subjected to back grinding to bring the back contacts 1240 into generally planar relationship to the substrate back surface 1242. That is, the substrate regions adjacent the trench 1226 that were not cut are removed so that the die has a back surface that is essentially flush with the back contacts 1240.

Figure 13A:
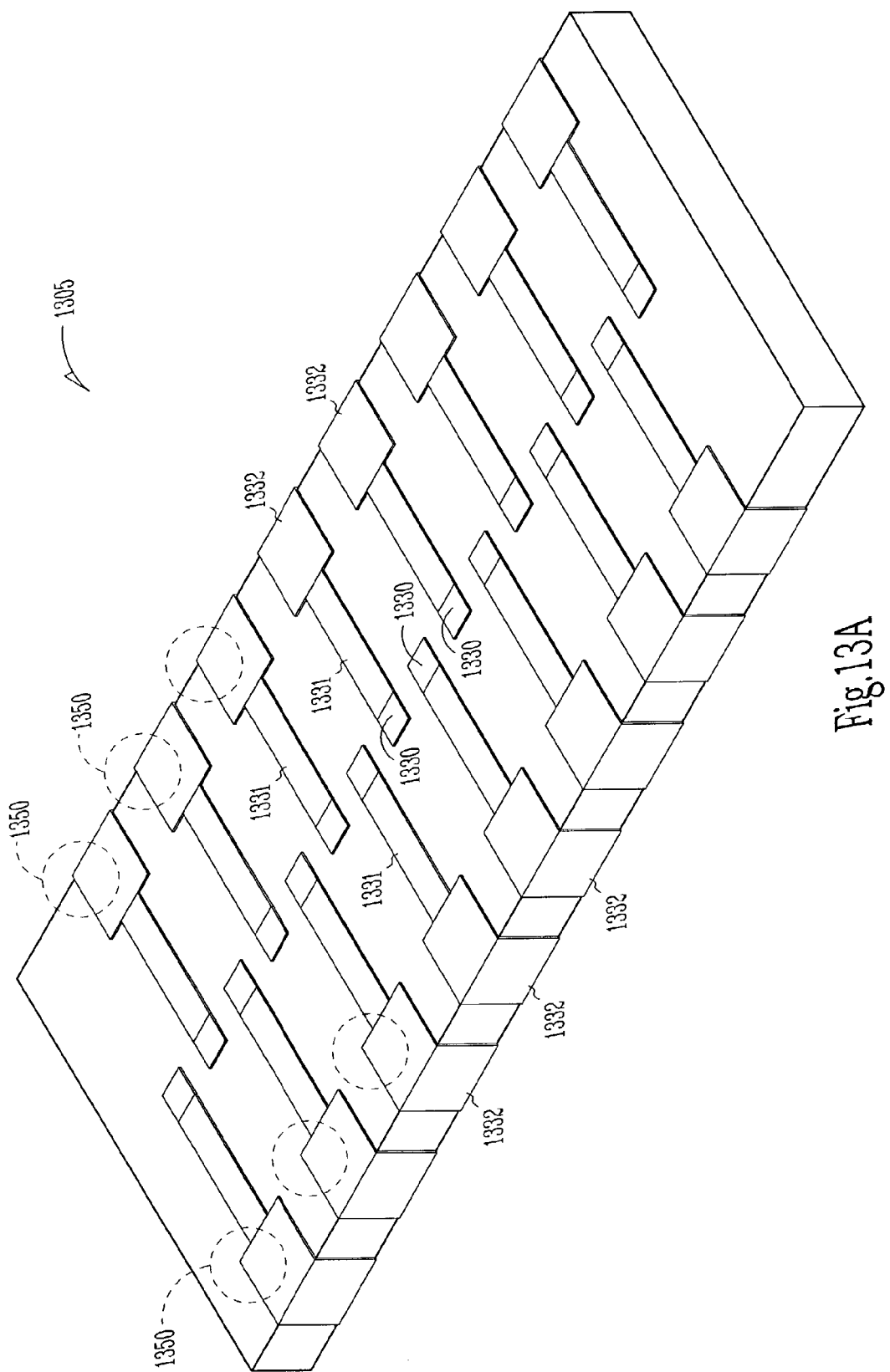
FIG. 13A is a top view of an embodiment of a die after a processing step.

FIG. 13A shows a top view of a finished die 1305 according to the present invention. Die 1305 includes a plurality of bond pads 1330 that are I/O pads, which connect the integrated circuits internal to the die to external circuits (not shown). A trace 1331 connects each bond pad 1330 to an edge contact 1332. The edge contacts 1332 include a portion on the top surface of the die and a portion on the side of the die extending from the die top surface to the die back surface. In an embodiment, the die 1305 includes at least one upstanding, conductive contact 1350 on at least one of the edge contacts 1332. In an embodiment, the contact 1350 is a ball contact. In an embodiment, the ball contact is a solder ball. In an embodiment, each of the edge contacts 1332 is connected to a contact 1350. Die 1305 has a plurality of traces that are generally parallel to each other and perpendicular to the sides of the die. Accordingly, die 1305 has back trenches (not shown) that only have one edge contact 1332 formed in alignment therewith. Thus, the number of back trenches is equal to the number of bond pads and traces in this embodiment.

Figure 13B:
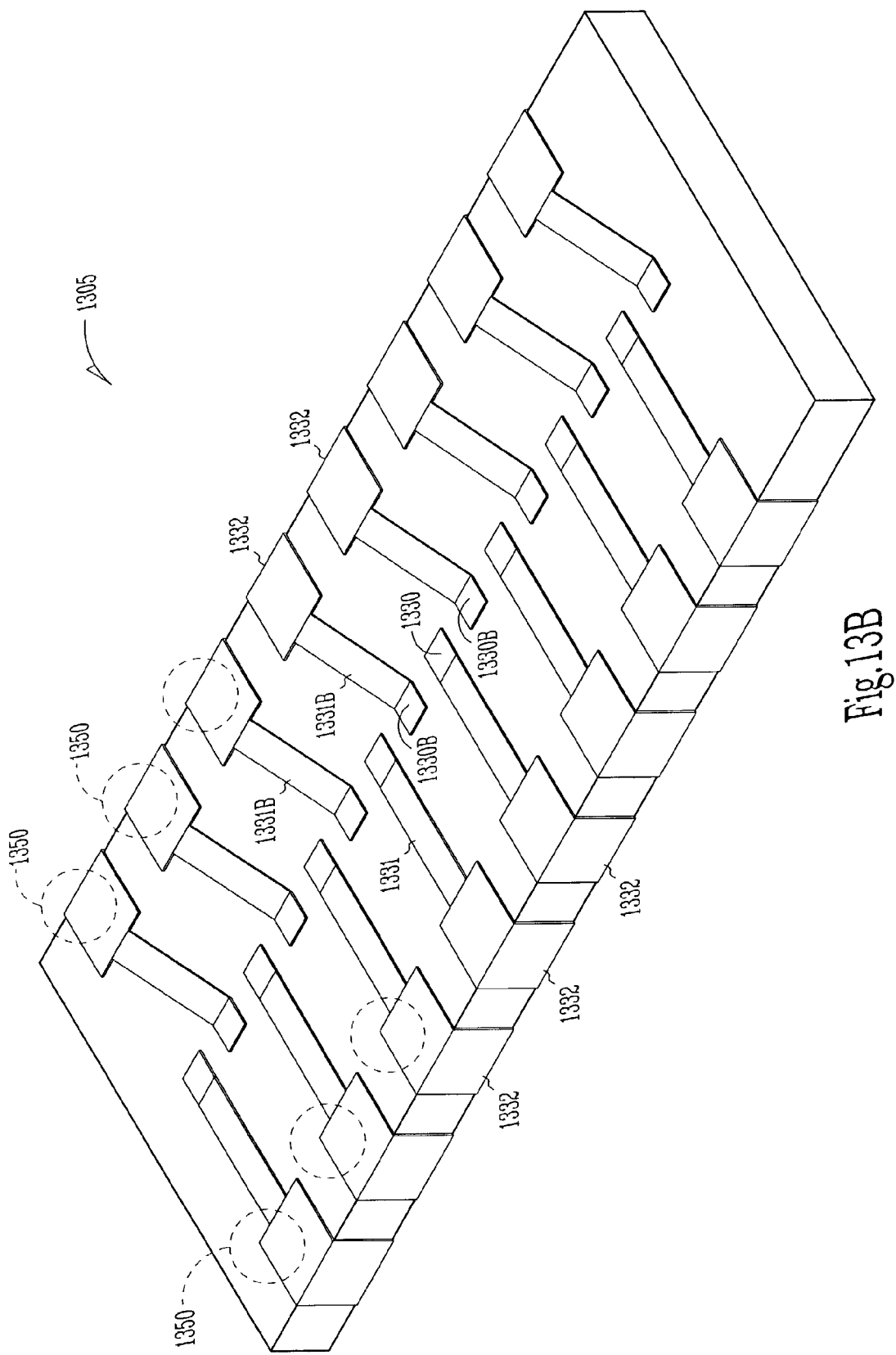
FIG. 13B is a top view of an embodiment of a die after a processing step.

FIG. 13B shows a top perspective view of a finished die 1305. The die includes pairs of contacts 1332 that are aligned with each other and positioned at opposite edges of the die 1305. One of the pair of contacts is connected to a bond pad 1330 through a trace 1331 that is also aligned with the pair of edge contacts 1332. The other of the pair of contacts is connected by a trace 1331B to a bond pad 1330B that is not aligned with the pair of contacts. The trace 1331B extends at an angle with respect to the edge of the die 1305 and with respect to the trace 1331. In an embodiment, the number of contacts 1332 are equal on both edges of the die 1305. The number of back trenches (not shown in FIG. 13B) is less than the number of bond pads 1330 as side contacts 1332 are formed at both ends of at least one trench. In an embodiment, each back trench includes one contact 1332 at each end of the trench. Accordingly, the number of back trenches formed in die 1305 is equal to half the number of bond pads 1330.

Figure 14:
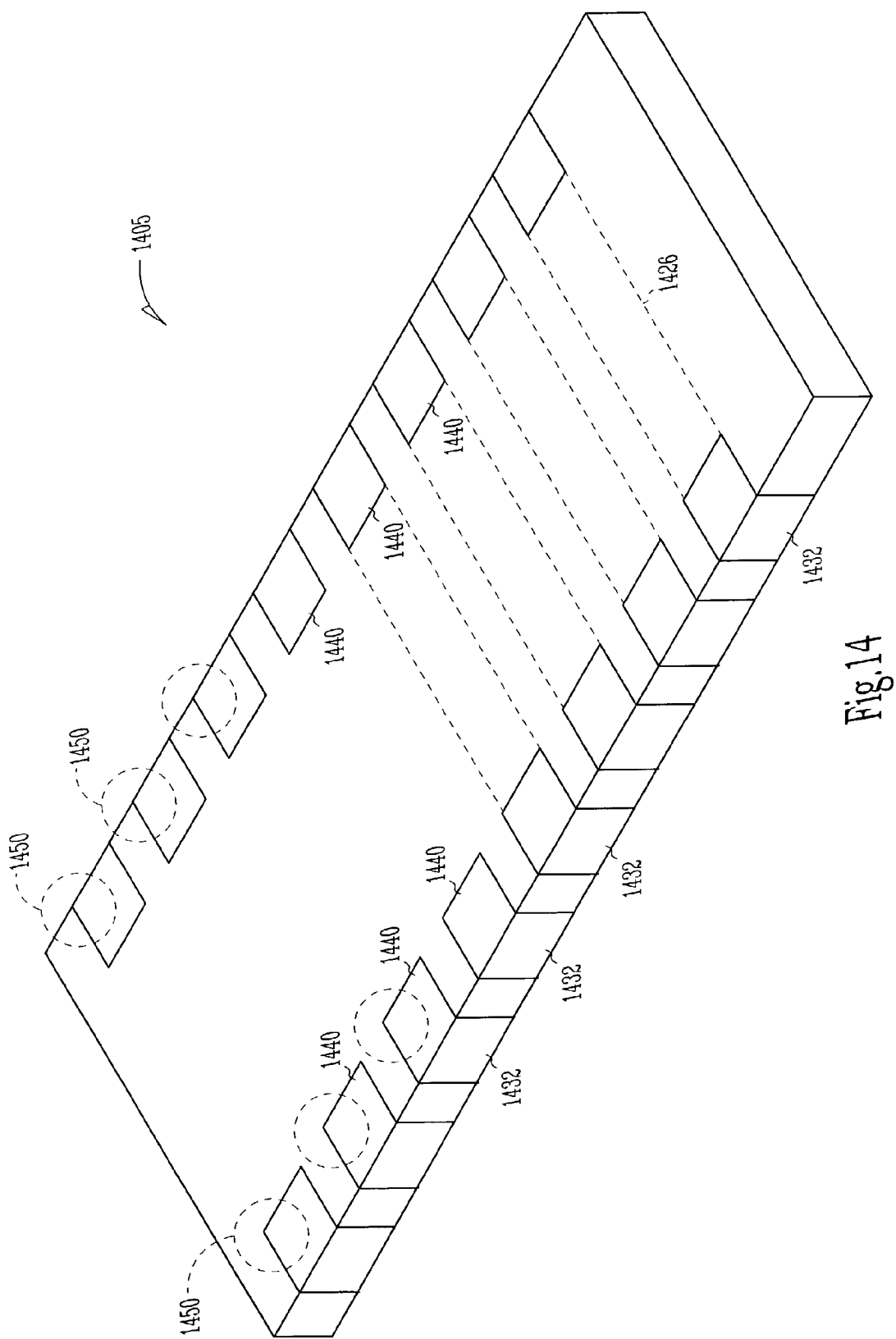
FIG. 14 is a bottom view of a die according to an embodiment of the present invention.

FIG. 14 shows a back view of a finished die 1405 according to the present invention. Die 1405 includes a plurality of edge contacts 1432 that extend from the die top surface to the die back surface. A plurality of back contacts 1440 are connected to the plurality of edge contacts 1432. Each edge contact 1432 is connected to one back contact 1440. Thus, the die 1405 includes contacts on the die top surface, die edge surface and the die back surface. One back contact 1440 is formed at each end of back trench 1426. In an embodiment, a contact 1450 is positioned on at least one back contact 1440. In an embodiment, contact 1450 is a solder ball. In an embodiment, each back contact 1440 has a contact 1450 thereon.

Figure 15:
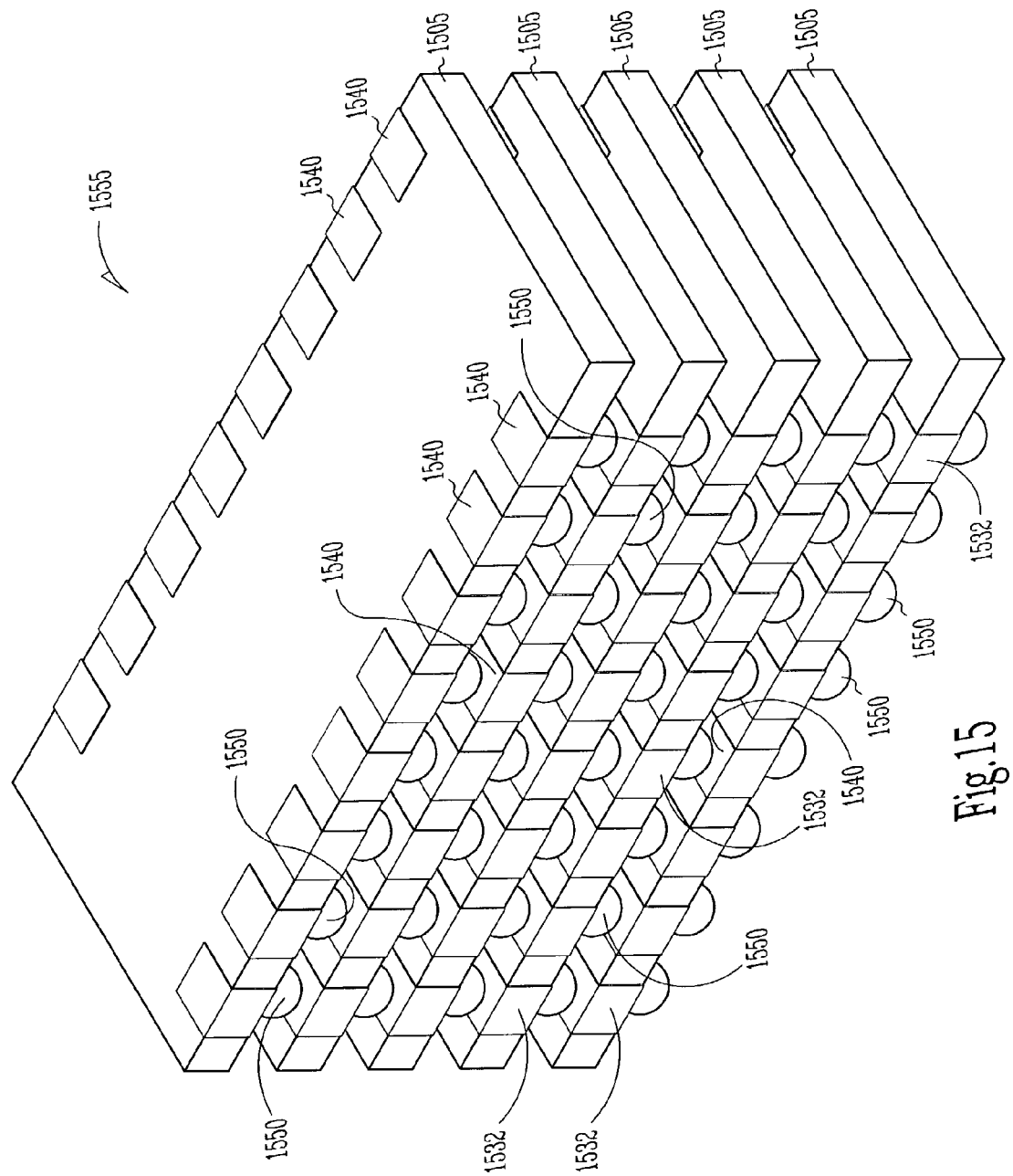
FIG. 15 is a stacked assembly of a plurality of dies according to the teachings of the present invention.

FIG. 15 shows a die stack 1555 that includes a plurality of dies 1505 electrically connected together. A die stack 1555 expands the functional capacity of the dies 1505. In an embodiment, each of the dies 1505 include memory devices. Thus, the die stack 1555 expands the memory capacity over a single die 1505. The contacts 1550 connect an upper die's substrate active surface contacts (not shown, but designated above as X32, where X is the figure number) to a lower dies non-active circuit side contacts 1540. The top most die 1505 as shown in FIG. 15 has its non-active, back substrate surface contacts 1540 free from other contacts. These contacts 1540, in an embodiment, are used to connect the die stack 1555 to an external circuit (not shown). The lower most die 1505 shown in FIG. 15 has its contacts 1550 free from contacting another die 1505. In an embodiment, these contacts 1550 connect the wafer stack to an external circuit (not shown). Thus, the dies 1505 having contacts on the top and back surface allow the dies to connected to adjacent dies such that the die stack 1555 has a profile that is essentially equal to the profile of the dies constituting the stack 1555 and the contacts 1550 intermediate adjacent dies. In an embodiment, contacts 1555 are controlled collapse connections that have a low profile, i.e., height. This provides a small stack height that is essentially the sum of the thicknesses of the dies 1505. In an embodiment, the back contacts 1550 connect the die stack to a BGA or other chip connect structure.

Figure 16:
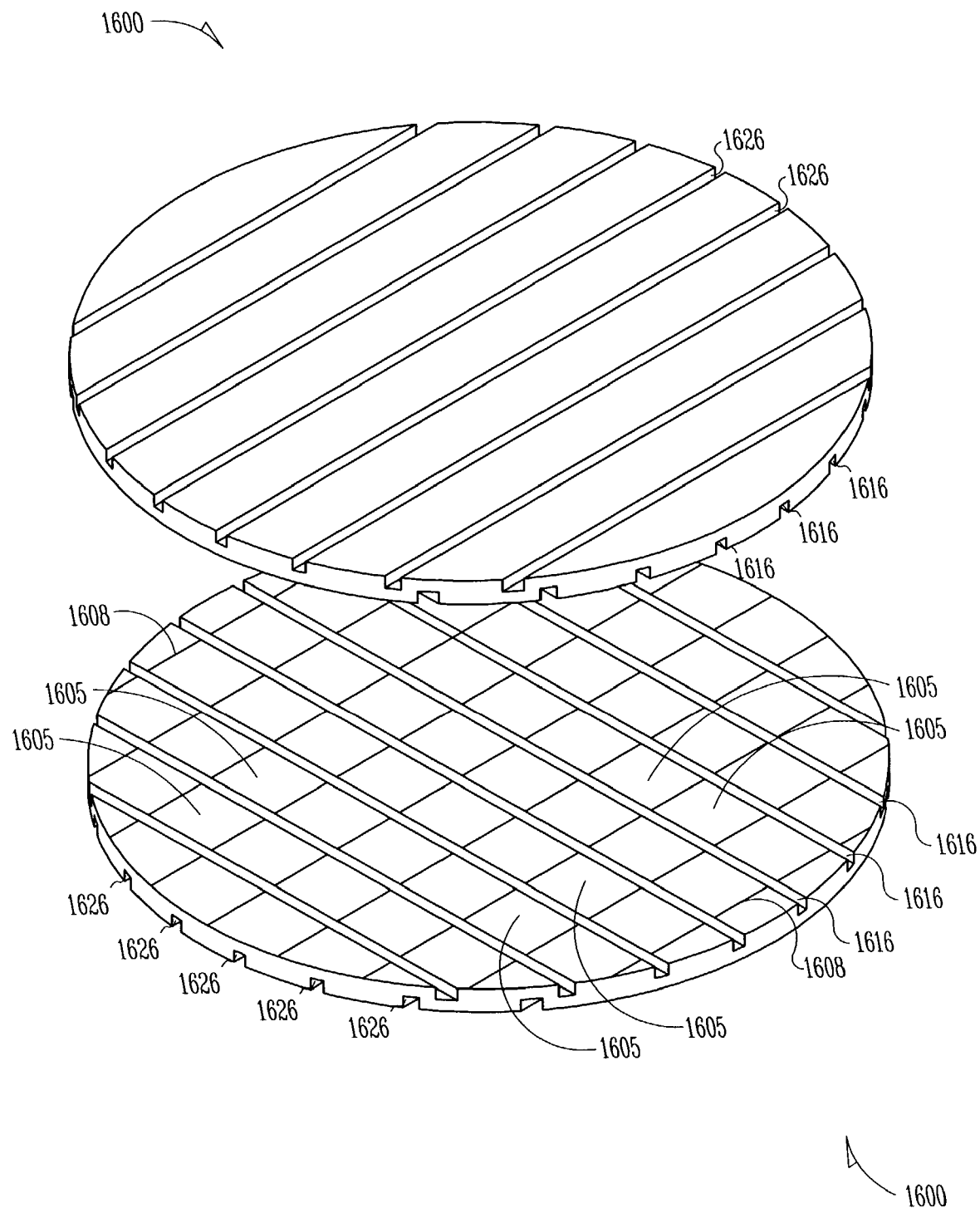
FIG. 16 is perspective view of a wafer stack according to an embodiment of the present invention.

FIG. 16 shows two wafers 1600, the top wafer being inverted relative to the bottom wafer such that the active device side or surface of the wafers 1600 face each other. Thus, the active device regions of dies 1605 of both wafers 1600 face each other. While not shown in FIG. 16 for reasons of clarity, each die 1605 includes bonding pads and traces that interconnect the bonding pads to edge contacts formed in through vias according to the teachings of the present invention. In an embodiment, the top portions of edge contacts on one of the wafers 1600 include connectors (not shown) that provide a direct connect to the top portions of the edge contacts on the other wafer 1600. Accordingly, each die 1605 of one wafer is electrically and physically connected to one die of the other wafer. Each wafer 1600 includes a plurality of through vias that are filled with a conductive material, thus the integrated circuits of each die 1605 is electrically accessible through the conductive material in the through vias. In an embodiment, the trough via connections form a portion of the edge contact. In an embodiment, back contacts as described herein are connected to the edge contacts. Thus, the back surface of at least one of the wafers 1600 is adapted to connected to an external circuit. Accordingly, the present invention provides contacts and connections to the dies through the vias formed according to the present invention such that external connections are made through the backside of at least one of the wafers 1600.

It will be recognized that it is with the scope of the present invention to connect the two wafers 1600 together by other methods known to one of skill in the art. For example, the wafers 1600, and the dies on each wafer, are connected by an anisotropic conductive film.

In an embodiment, at least one of the wafers 1600 is subjected to back grinding to further thin the wafer according to the teachings of the present invention. This causes the contacts formed by conductive material in the through vias or back contacts formed in the trenches 1626 to be at the back surface of the at least one wafer 1600. Thus, the wafer 1600 can be mounted in its non-singulated state.

In an embodiment, the stacked and connected wafers 1600 are singulated or diced such that the interconnected, facing dies remain joined together. Thus, the individual units each include two dies, one die from each of the two wafers. The external circuit is connected to these individual units at the edge contacts in an embodiment. In an embodiment, the external circuit is connected to these individual units at the back contacts.

Figure 17A:
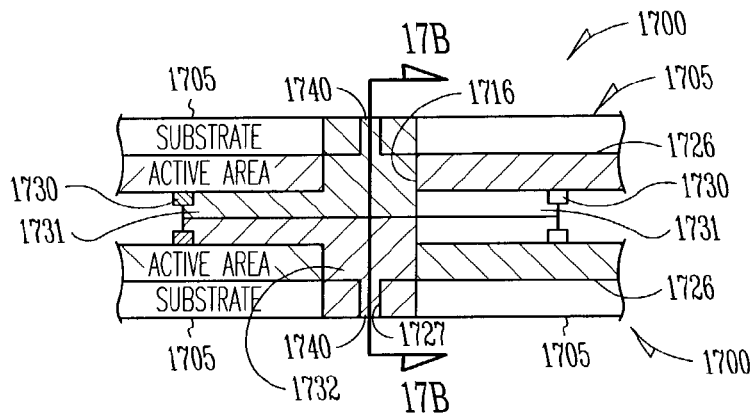
FIG. 17A is a cross sectional view of a partial wafer stack of the present invention.

FIG. 17A shows a cross-sectional, partial view of substrate stack that has two substrates 1700. The cross-section is taken generally along vertically-aligned, back side trenches 1726 of the two stacked substrate 1700. Each substrate 1700 includes at least two die 1705. The two die of the top substrate are positioned directly above the two die of the bottom substrate. Bond pads 1730 are formed on the active circuit side of the dies 1705. The bond pads 1730 of the bottom die are aligned with bond pads of the die that is positioned above the bottom die. Traces 1731 extend from the bond pads 1730 outwardly to the side of the die 1705. Edge contacts 1732 are formed aligned with the non-active side trench intermediate the dies 1705 that are formed on the same substrate. In the embodiment shown, the dies at the bottom are formed on the same substrate and the dies at the top are formed on the same substrate. The non-active side trenches cross the active side trenches 1716 at intersections to form through holes 1727 that extend from the top to the back of the respective substrate and die. The through holes 1727 are filled with conductive material and connect to non-active side contacts 1740. The dies 1705 thus are interconnected at the vertically aligned bond pads 1730 and vertically aligned traces 1731. Contacts 1740 at non-active sides of the connected, vertically aligned dies 1705 provide connections to external circuits (not shown).

Figure 17B:
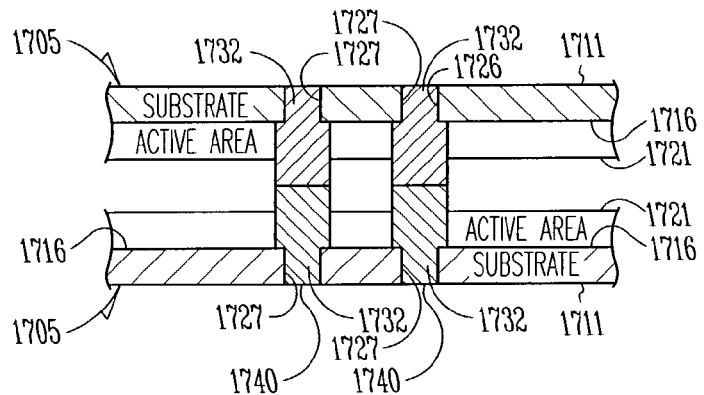
FIG. 17B is a cross sectional view taken generally along line 17B-17B of FIG. 17A.

FIG. 17B shows a cross-sectional, partial view of substrate 1700 generally along line 17B-17B of FIG. 17A. The line 17B-17B generally follows active circuit side trenches 1716 of both substrates, which trenches 1716 are vertically aligned.

Figure 18:
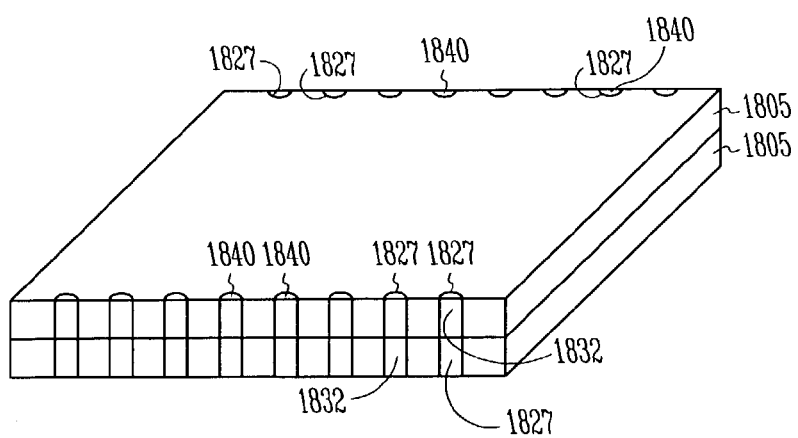
FIG. 18 is a perspective view of a singulated die stack of the present invention.

FIG. 18 shows a die stack that includes two die 1805 that are stacked top side to top side. That is, the active areas of the two die are adjacent one another. The two die 1805 are joined together as discussed above in a wafer form in an embodiment. Thus, the top die 1805 is from a different substrate or wafer than the bottom die 1805. Then, the joined wafers are diced to separate pairs of dies 1805 from adjacent pairs of dies. The through vias 1827 are aligned between the dies 1805 and are separated when the joined dies are separated from the adjacent dies. The vias 1827 are filed with a conductive material such that the vias with conductive material for interconnection between the two, joined die 1805. The vias 1827 filled with conductive material further define edge contacts and back contacts that connect the stacked dies 1805 to external circuits (not shown).

Figure 19:
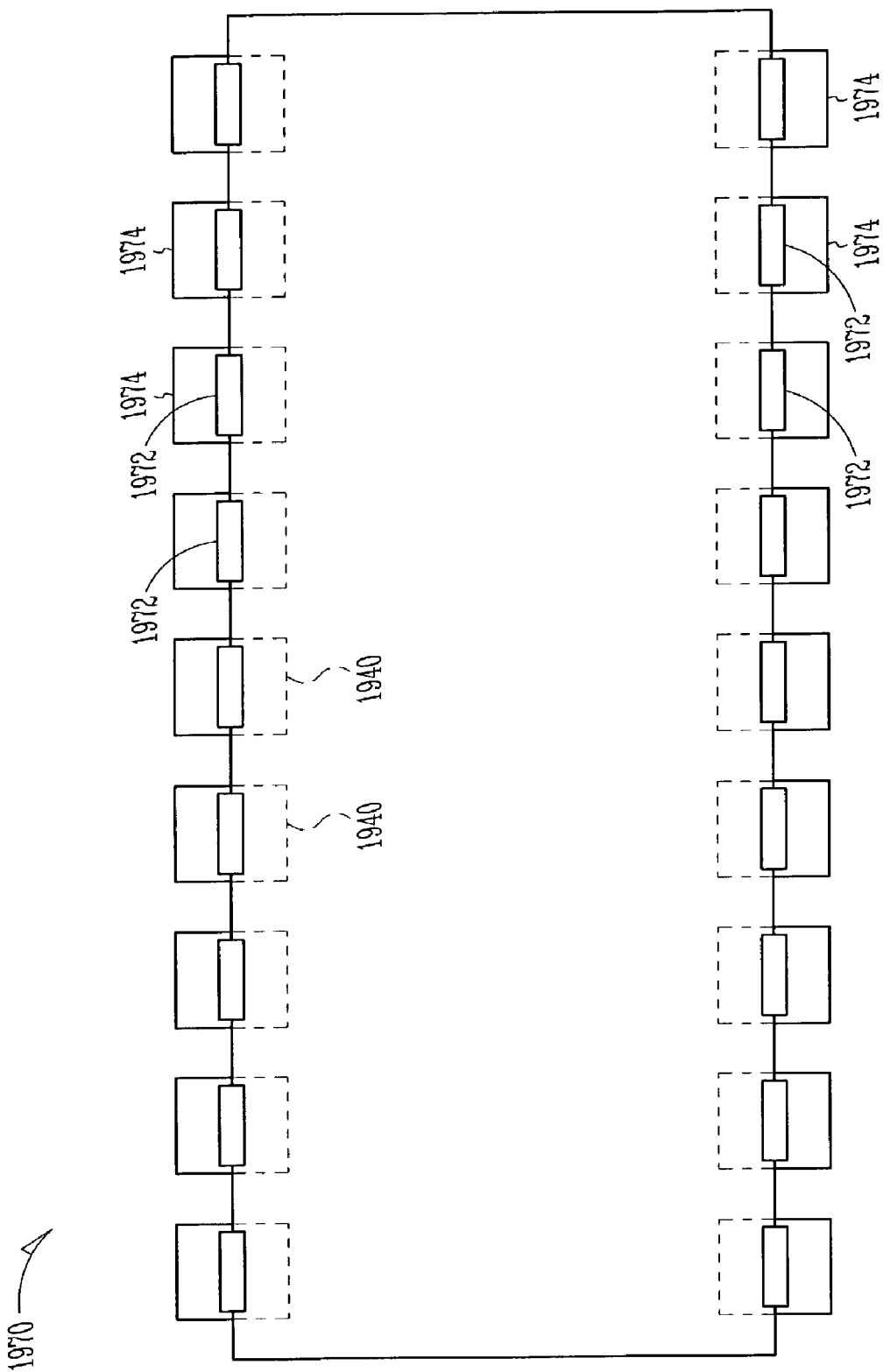
FIG. 19 is a plan view of a package according to an embodiment of the present invention.

FIG. 19 shows a top view of a package 1970 according to the present invention. The package 1970 includes one of a die, die stack, or wafer stack that includes back contacts 1940. The die is encapsualted in a protective case that seals the active area from the environment. Connectors 1972 extend through the protective case and electrically contact the back contacts 1940. Connectors 1972 further connect to leads 1974 that allow the package 1970 to connect to external circuits, which include address and data buses and control circuits.

A method for fabricating a wafer level package according to an embodiment of the present invention includes fabricating an active area on a substrate. The active area includes integrated circuits. In an embodiment, the integrated circuits form memory devices. In an embodiment, the integrated circuits perform logic functions or processor tasks. In an embodiment, the active area is a system on a chip device that includes logic functions and memory functions. The saw streets intermediate the integrated circuits are partially cut in a first direction to form trenches or kerfs. The non-active regions of the substrate, generally beneath the integrated circuits or dies are partially cut to form non-active side or back trenches or kerfs. In an embodiment, a plurality of cuts in the non-active regions of the substrate are made to form a plurality of non-active side trenches. Where the active side trenches and non-active side trenches intersect there are formed through vias in the substrate. These through vias provide holes, which when filled with a conductive material provide contacts on both the active (top) surface of the substrate and the non-active (back) surface of the substrate.

Numerous devices are adaptable for use with a wafer level package as described herein. Such devices include individual IC packages, sometimes referred to as chips, circuit modules, memory modules, and computers and electronic systems. Individual IC packages include a die having an individual pattern, typically rectangular, on a substrate that contains circuitry, or integrated circuit devices, to perform a specific function, such as memory functions, logic functions, and address functions. A semiconductor wafer will typically contain a repeated pattern of such dies containing the same functionality. The individual IC package includes structures of the present invention or is manufactured according to the methods of the present invention. The individual IC package, in an embodiment, further contains additional circuitry to extend to such complex devices as a monolithic processor with multiple functionality and/or a processor and memory module in a single IC package. Individual IC packages typically include a protective casing (not shown) with leads extending therefrom (not shown) providing access to the circuitry of the IC package for unilateral or bilateral communication and control. In an embodiment, the leads are connected to the edge contacts, ball contacts or other contacts as described herein.

Circuit modules include two or more dies that are combined, with or without protective casing. Such a combination enhances or extends the functionality of an individual die. The circuit module includes a combination of dies representing a variety of functions, or a combination of dies containing the same functionality. One or more dies of circuit module contain structures according to the present invention or are formed by methods of the present invention. Some examples of a circuit module include memory modules, device drivers, power modules, communication modems, processor modules and application-specific (ASIC) modules, and may include multilayer, multichip modules. The circuit module is, in an embodiment, a subcomponent of a variety of electronic systems, such as a clock, a television, a cell phone, a personal computer, personal data assistant, an automobile, an industrial control system, an aircraft and others. The circuit module has a variety of leads extending therefrom and coupled to the dies providing unilateral or bilateral communication and control.

One form of a circuit module is a memory module. The memory module contains multiple memory IC devices on support, the number of IC devices generally depending upon the desired bus width and the desire for parity. The memory module accepts a command signal from an external controller (not shown) on a command link and provides for data input and data output on data links. The command link and data links are connected to leads extending from the support. The memory module and/or the dies that constitute at least part of the memory module include structures of the present invention or are formed according to methods of the present invention.

Electronic systems include one or more circuit modules. An electronic system generally contains a user interface that communicates with an electronic unit, that processes or stores electrical information. The user interface provides a user of the electronic system with some form of control or observation of the results of the electronic unit. Some examples of user interface include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. The user interface, in an embodiment, provides access ports provided to electronic unit. Access ports are used to connect an electronic unit to the more tangible user interface components previously exemplified. One or more of the circuit modules include a processor providing some form of manipulation, control or direction of inputs from or outputs to user interface, or of other information either preprogrammed into, or otherwise provided to, the electronic unit. As will be apparent from the lists of examples previously given, electronic system is, in an embodiment, associated with certain mechanical components (not shown) in addition to the circuit modules and the user interface. It will be appreciated that the one or more circuit modules in the electronic system are replaced by a single integrated circuit in an embodiment. In an embodiment, the electronic system is a subcomponent of a larger electronic system. It will also be appreciated that at least one of the memory modules includes structures according to the present invention or is formed according to methods according to the present invention.

A specific embodiment of an electronic system as a memory system. The memory system includes one or more memory modules and a memory controller. The memory modules each contain one or more memory IC devices. In an embodiment, at least one of memory devices includes structures according to the present invention or is fabricated according to the present invention. The memory controller provides and controls a bidirectional interface between memory system and an external system bus. The memory system accepts a command signal from the external bus and relays it to the one or more memory modules on a command link. The memory system provides for data input and data output between the one or more memory modules and external system bus on data links.

Another specific embodiment of an electronic system as a computer system. The computer system includes a processor and a memory system housed in a computer unit. The computer system is but one example of an electronic system containing another electronic system, i.e., the memory system, as a subcomponent. The computer system optionally contains user interface components. User interface components include, but are not limited to a keyboard, a pointing device, a monitor, a printer and a bulk storage device. It will be appreciated that other components are often associated with computer system such as modems, device driver cards, additional storage devices, etc. It will further be appreciated that the processor and the memory system of the computer system, in an embodiment, are incorporated on a single die or IC package. Such single package processing units reduce the communication time between the processor and the memory circuit. It will be appreciated that at least one of the processor and the memory system contain an IC package according to the present invention The above description refers to numerous views of substrates that illustrate embodiments of the present invention. These views are, at times, drawn to an enlarges, simplified scale to illustrate the present invention. For example, the saw streets and dies shown in FIG. 4 are shown in a greater enlarges scale. Hundreds of die are formed on a single substrate. The saw streets are formed as small as possible to allow more dies to be formed on a single substrate.

CONCLUSION

The forming of the through vias or apertures as described herein provides a true wafer level package, e.g., a chip profile. That is, a significant space savings is achieved by producing a small package size. The dimensions of the through vias are determined by the size of the mechanical cutters used to form the partial cuts in the substrate. That is, with a saw blade, the width of the blade making the cut in the substrate top surface determines one dimension (e.g., length). The width of a blade making the cut in the substrate back surface determines another dimension (e.g., width). Accordingly, the dimensions of the via can be made as small as the width of saw blades. In an embodiment, a dimension of the via is about 0.2 mm. The techniques described herein provide a low cost and an industrial acceptable method to produce through vias compared to conventional etching and laser drill techniques. As a result, space savings are achieved in packaging a substrate according to the present invention.

The invention claimed is:

1. A method of creating vias through a wafer, comprising:
sawing into a fabrication side of the wafer;
sawing into a backside of the wafer to form a number of trenches so that the sawing on the fabrication side and the number of trenches cross each other to form the vias;
forming bonding pads by metalization of a nonmasked area of the wafer; and
conductively connecting the vias to a number of bonding pads formed in single lines, a single line of the bonding pads being formed parallel to and equal distant between two sawings on the fabrication side, and wherein the number of trenches is less than the number of bonding pads.

2. The method of claim 1, wherein sawing into the fabrication side includes sawing about half the thickness of the wafer.

3. The method of claim 1, wherein sawing into the fabrication side includes sawing through over about half the thickness of the wafer.

4. The method of claim 1, wherein sawing into the fabrication side includes sawing about three-quarters the thickness of the wafer.

5. The method of claim 1, wherein sawing the fabrication side includes sawing in saw streets in the wafer.

6. A method of creating a via through a wafer, comprising:
sawing into a fabrication side of the wafer using a saw blade;
flipping the wafer;
sawing into a backside of the wafer using the saw blade to form a number of trenches, so that the sawing on the fabrication side and sawing on the backside cross each other to form vias; and
conductively connecting the vias to a number of bonding pads formed in single lines, wherein the bonding pads are formed by metalization of a nonmasked area of the wafer, a single line of the bonding pads being formed parallel to and equal distant between two sawings on the fabrication side, and wherein the number of trenches is less than the number of bonding pads.

7. The method of claim 6, wherein sawing into the fabrication side includes sawing about three-quarters the thickness of the wafer.

8. The method of claim 6, wherein sawing the fabrication side includes sawing in saw streets in the wafer.

9. A method of creating vias through a substrate, comprising:
sawing into a fabrication side of the substrate;
sawing into a backside of the substrate to form a number of trenches so that the sawing on the fabrication side and the number of trenches cross each other to form the vias;
forming bonding pads by metalization of a nonmasked area of the wafer; and
conductively connecting the vias to a number of bonding pads, the bonding pads formed in single lines, a single line of the bonding pads being formed parallel to and equal distant between two sawings on the fabrication side, and wherein the number of trenches is less than the number of bonding pads.

10. The method of claim 9, wherein sawing into the fabrication side includes sawing about half the thickness of the substrate.

11. The method of claim 9, wherein sawing into the fabrication side includes sawing through over about half the thickness of the substrate.

12. The method of claim 9, wherein sawing into the fabrication side includes sawing about three-quarters the thickness of the substrate.

13. The method of claim 9, wherein sawing the fabrication side includes sawing in saw streets in the substrate.

14. A method of creating a via through a substrate, comprising:
   metalizing a nonmasked area of the wafer to form bonding pads;
   sawing into a fabrication side of the substrate using a saw blade;
   flipping the substrate;
   sawing into a backside of the substrate using the saw blade to form a number of trenches, so that saw paths on the fabrication side and the trenches on the backside cross each other to form vias; and
   conductively connecting the vias to a number of bonding pads formed in single lines, a single line of the bonding pads being formed parallel to and equal distant between two sawings on the fabrication side, and wherein the number of trenches is less than the number of bonding pads.

15. The method of claim 14, wherein sawing into the fabrication side includes sawing about three-quarters the thickness of the substrate.

16. The method of claim 14, wherein sawing the fabrication side includes sawing in saw streets in the substrate.

17. An integrated circuit fabrication method, comprising:
   forming an integrated circuit on a first fabrication side of a substrate;
   mechanically trenching the first side of the substrate to form more than one first trench; and
   mechanically trenching a second back side of the substrate to form at least one second trench that crosses the first trench at an intersection, whereby the intersection forms a via from the first side to the second side; and
   conductively connecting the via is to a number of bonding pads on the substrate, wherein the bonding pads are formed by metalization of a nonmasked area of the wafer, the bonding pads formed in single lines, a single line of the bonding pads being formed equal distant between and parallel to two first trenches, and wherein the number of second trenches is less than the number of bonding pads.

18. The method of claim 17, further comprising filling the via with a conductor.

19. The method of claim 18, further comprising connecting the conductor to the integrated circuit.

20. The method of claim 17, wherein mechanically trenching the first side includes sawing the substrate.

21. The method of claim 20, wherein sawing includes sawing in saw streets intermediate a plurality of integrated circuits in the substrate.

22. The method of claim 17, wherein mechanically trenching the second side of the substrate includes sawing orthogonally to the first trench.

23. The method of claim 17, wherein mechanically trenching the second side of the substrate includes sawing the substrate beneath the integrated circuit.

24. A method for forming through holes in a substrate, comprising:
   forming more than one first trench on a fabrication side of a substrate, each trench in a saw street of a substrate;
   forming a plurality of second trenches in a backside of a substrate so that the second trenches intersect the first trenches to form a plurality of through holes; and
   conductively connecting the through holes to a number of bonding pads, wherein the bonding pads are formed by metalization of a nonmasked area of the wafer, the bonding pads formed in single lines, a single line of bonding pads formed parallel to and equal distant between two first trenches, and wherein the number of second trenches is less than the number of bonding pads.

25. The method of claim 24, wherein forming the plurality of second trenches includes forming the plurality of second trenches beneath the active area of the substrate.

26. The method of claim 25, wherein forming the plurality of through holes includes forming through vias at the through holes.

27. The method of claim 25, wherein forming the plurality of second trenches includes forming N plurality of second trenches that is equal to half a number of bond pads on the substrate.

28. The method of claim 27, wherein forming a plurality of second trenches includes inserting a conductor at each intersection of the first trench and the plurality of second trenches.

29. The method of claim 28, wherein inserting a conductor includes forming a trace that connects a bond pad with at least one of the conductors in the intersection.

30. A method of fabricating an integrated circuit device, comprising:
   providing a substrate that includes at least one integrated circuit device;
   forming more than one first trench in a first direction on a fabrication side of the substrate;
   forming a second trench in a second direction on a backside of the substrate so that the second trench crosses the first trench to form a through via in the substrate from the first side to the second side; and
   conductively connecting the through via to a number of bond pads, wherein the bonding pads are formed by metalization of a nonmasked area of the wafer, the bonding pads formed on the first side in single lines, a single line of the bonding pads being formed parallel to and equal distant between two first trenches, wherein the number of bond pads is greater than the number of second trenches; and
   inserting a conductor in the through via to form an electrical connection on both the first side and the second side.

31. The method of claim 30, wherein providing the substrate includes forming a plurality of integrated circuits on a wafer intermediate saw streets.

32. The method of claim 31, wherein providing the substrate includes forming saw streets in the first direction, and wherein forming the first trench includes forming the first trench in the saw streets extending in the first direction.

33. The method of claim 32, wherein forming the second trench includes forming the second trench in a backside of the wafer beneath the integrated circuits.

34. The method of claim 33, wherein providing the substrate includes providing a bond pad on the first side of the wafer and connecting the bond pad to the conductor in the through via.

35. The method of claim 34, wherein providing the substrate includes dicing the substrate through the through via.

* * * * *

UNITED STATES PATENT AND TRADEMARK OFFICE
CERTIFICATE OF CORRECTION

PATENT NO.         : 7,375,009 B2                                   Page 1 of 1
APPLICATION NO.    : 10/232267
DATED              : May 20, 2008
INVENTOR(S)        : Chua et al.

It is certified that error appears in the above-identified patent and that said Letters Patent is hereby corrected as shown below:

On the title page, item (54), under "Title", in column 1, lines 1-2, delete "Method Of Forming A Conductive Via Through A Wafer" and insert -- Wafer Level Packaging --, therefor.

In column 1, lines 1-2, delete "Method Of Forming A Conductive Via Through A Wafer" and insert -- Wafer Level Packaging --, therefor.

Signed and Sealed this

Twenty-sixth Day of August, 2008

JON W. DUDAS
*Director of the United States Patent and Trademark Office*